United States Patent
Shukla et al.

(10) Patent No.: US 10,037,810 B1
(45) Date of Patent: Jul. 31, 2018

(54) METHOD AND APPARATUS FOR COUPLING UP A VOLTAGE-SETTING TRANSISTOR FOR A CONTROL LINE IN A PROGRAMMING OPERATION

(71) Applicant: SanDisk Technologies LLC, Plano, TX (US)

(72) Inventors: Hemant Shukla, Edinburgh (GB); Saurabh Kumar Singh, Edinburgh (GB); Sridhar Yadala, Bangalore (IN); Raul-Adrian Cernea, Santa Clara, CA (US); Anirudh Amarnath, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/634,006

(22) Filed: Jun. 27, 2017

(51) Int. Cl.
*G11C 16/04* (2006.01)
*G11C 16/30* (2006.01)
*G11C 16/10* (2006.01)
*G11C 16/08* (2006.01)
*G11C 16/26* (2006.01)

(52) U.S. Cl.
CPC .............. *G11C 16/30* (2013.01); *G11C 16/08* (2013.01); *G11C 16/10* (2013.01); *G11C 16/26* (2013.01)

(58) Field of Classification Search
CPC .......... G11C 13/004; G11C 2013/0054; G11C 13/0004; G11C 13/0007; G11C 13/0061; G11C 13/0069; G11C 13/025; G11C 2013/0042; G11C 2213/35; G11C 2213/82; G11C 23/00; G11C 29/02; G11C 29/021; G11C 29/023

USPC ..... 365/203, 104, 149, 185.18, 189.09, 208, 365/226, 230.03, 148, 185.05, 185.09
See application file for complete search history.

(56) References Cited

U.S. PATENT DOCUMENTS

| | | | |
|---|---|---|---|
| 6,768,369 B1 | 7/2004 | Dunn et al. | |
| 7,593,265 B2 | 9/2009 | Nguyen et al. | |
| RE45,731 E | 10/2015 | Li | |
| 9,208,889 B2 | 12/2015 | Toyama et al. | |
| 9,208,895 B1 | 12/2015 | Huynh et al. | |
| 9,349,468 B2 | 5/2016 | Louie et al. | |
| 2005/0145895 A1* | 7/2005 | Luk .......................... | G11C 7/06 257/288 |

(Continued)

OTHER PUBLICATIONS

Hu, C., "Chapter 5—MOS Capacitor," Semiconductor Devices for Integrated Circuits, Feb. 13, 2009, 38 pages.

*Primary Examiner* — Thong Q Le
(74) *Attorney, Agent, or Firm* — Vierra Magen Marcus LLP

(57) ABSTRACT

The peak voltage at which a voltage-setting transistor is driven is reduced while the body effect of the transistor is also compensated. The voltage-setting transistor is driven at an initial level and then coupled higher by a capacitor which is connected to the control gate of the voltage-setting transistor. The amount of coupling can vary as a function of an assigned data state of a memory cell connected to the transistor by a source line and/or bit line. The capacitor may have a body which is common to a set of memory cells. The voltage can be set prior to applying a program voltage to the control gate of a memory cell to control a programming speed of the memory cell based on its assigned data state. The voltage can also be set in connection with a sensing operation.

20 Claims, 20 Drawing Sheets

(56) References Cited

U.S. PATENT DOCUMENTS

2016/0141301 A1    5/2016  Mokhlesi et al.
2016/0351254 A1  12/2016  Li et al.
2017/0117024 A1    4/2017  Amarnath et al.

\* cited by examiner

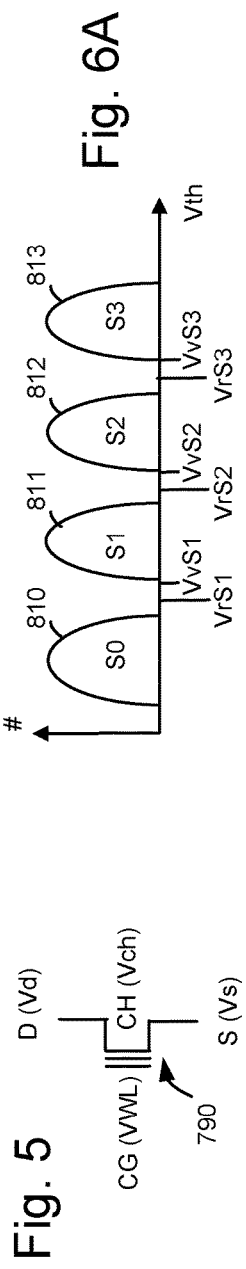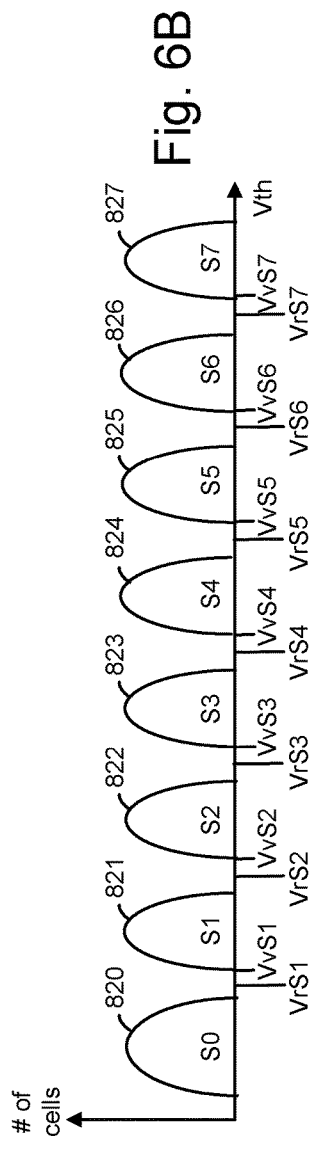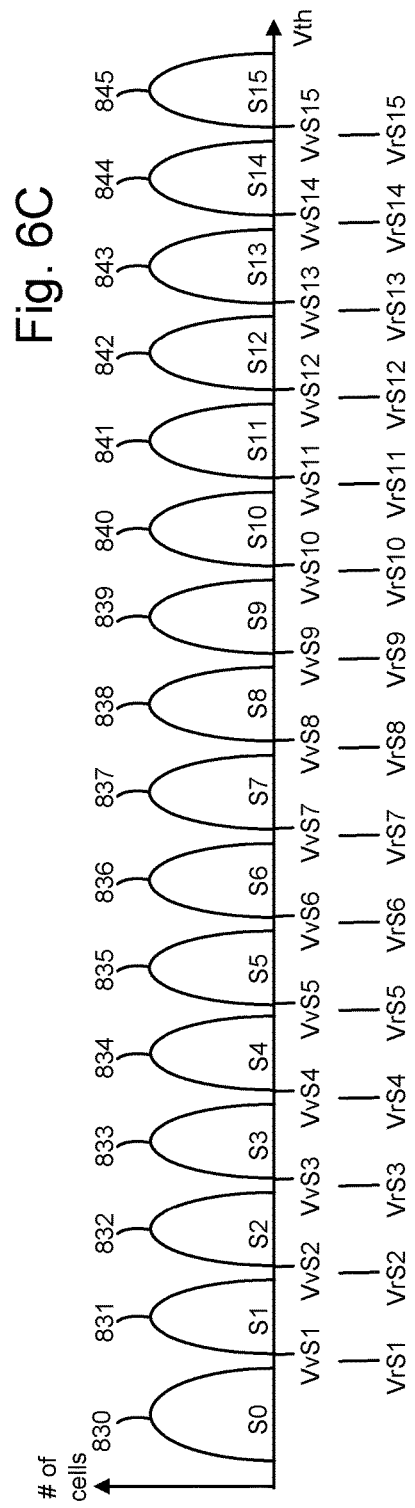

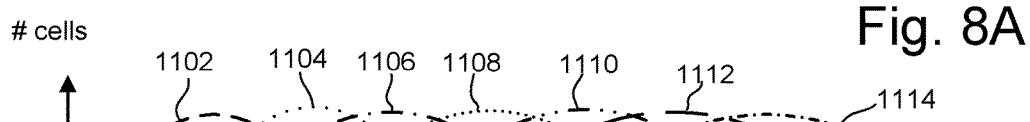
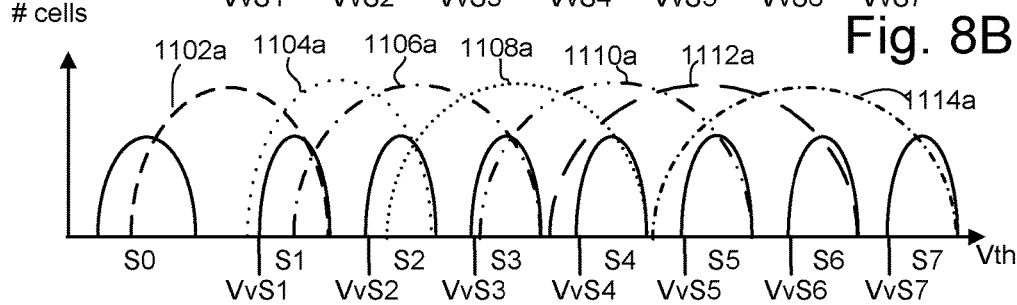
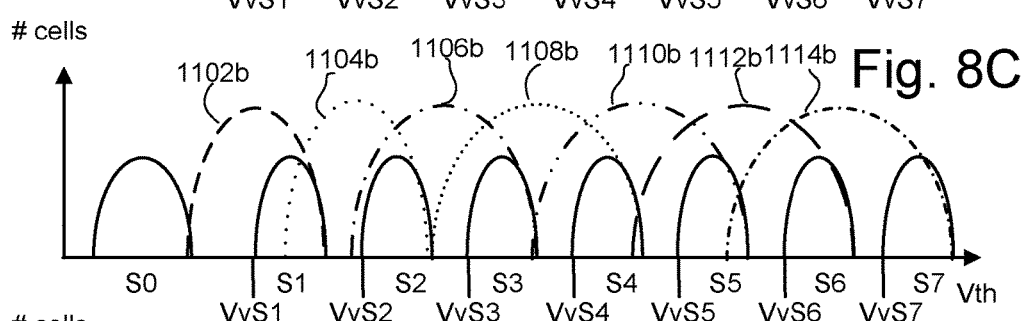
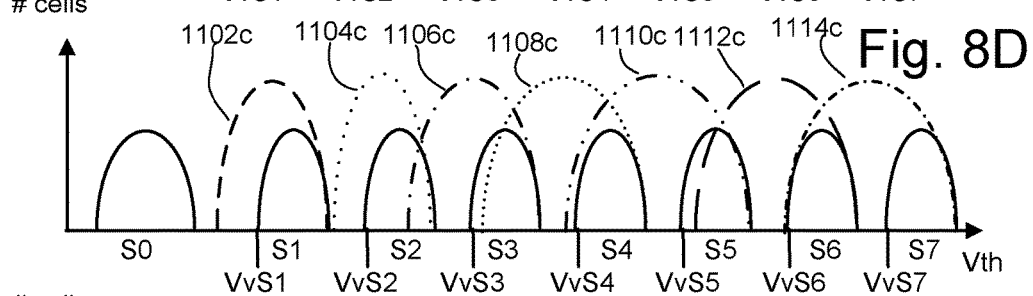
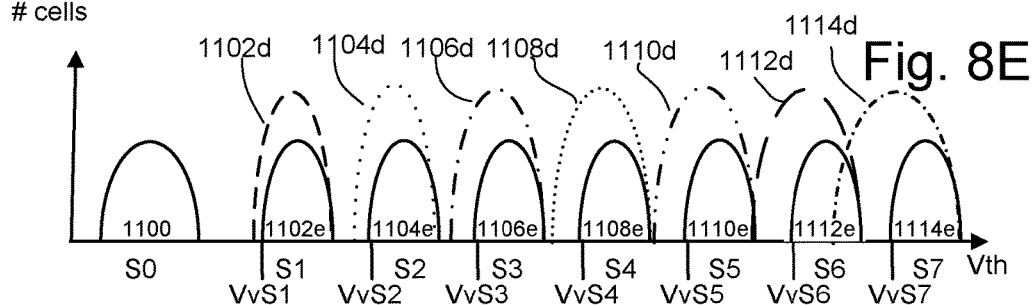

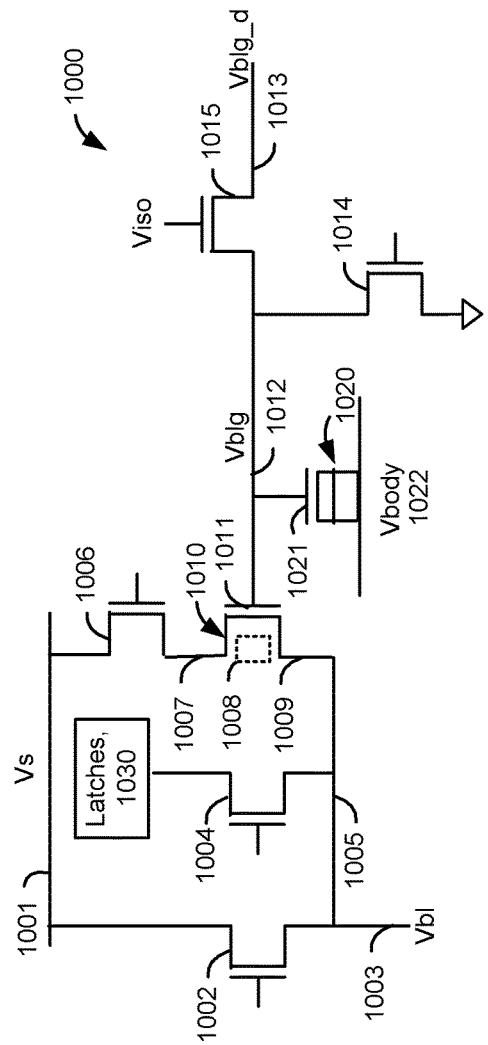

US 10,037,810 B1

METHOD AND APPARATUS FOR COUPLING UP A VOLTAGE-SETTING TRANSISTOR FOR A CONTROL LINE IN A PROGRAMMING OPERATION

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

Various types of non-volatile memory cells can be used in such memory devices. In one approach, a charge-storing material such as a floating gate or a charge-trapping material can be used in a memory cell to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. In another approach, a memory cell comprises a resistance-switching material. Other types of non-volatile memory cells can be used as well.

However, various challenges are presented in operating a memory device.

BRIEF DESCRIPTION OF THE DRAWINGS

FIG. 5 depicts an example memory cell.

FIG. 6A depicts an example Vth distribution of memory cells, where four data states are used.

FIG. 6B depicts an example Vth distribution of memory cells, where eight data states are used.

FIG. 6C depicts an example Vth distribution of memory cells, where sixteen data states are used.

FIG. 8A depicts the results of applying the first program voltage 921 in FIG. 7A.

FIG. 8B depicts the results of applying the second program voltage 922 in FIG. 7A.

FIG. 8C depicts the results of applying the third program voltage 923 in FIG. 7A.

FIG. 8D depicts the results of applying the fourth program voltage 924 in FIG. 7A.

FIG. 8E depicts the results of applying the fifth program voltage 925 in FIG. 7A.

FIG. 9A is a table that identifies one embodiment of data dependent bit line voltages for programming, verifying and reading, consistent with FIG. 7A to 8E.

FIG. 9B is a table that provides example voltages for the drain side select signal (VSGD), source side select signal (VSGS), selected word line (WL N), unselected word lines on the source side of the selected word line (WL#≤N−1), and unselected word lines on the drain side of the selected word line (WL#≥N+1), consistent with FIG. 7A to 8E.

FIG. 10 depicts an example circuit which is used to provide different bit line and/or source line voltages such as in FIG. 9A.

DETAILED DESCRIPTION

Apparatuses and techniques are described for controlling a voltage-setting transistor in a memory device.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in channel gradient.

Figure 7A:
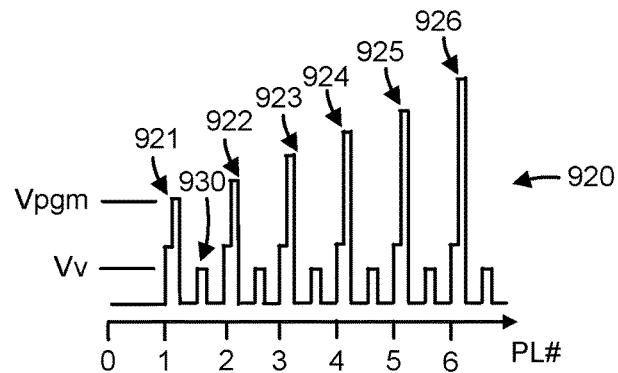
FIG. 7A depicts a waveform 920 of an example programming operation, where one verify voltage is applied for verifying different data states.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 7A. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to user data associated with a program command. Generally, a memory device comprises memory cells which store words of user data as code words. Each code word comprises symbols, and each data state represents one of the symbols. When a cell stores n bits of data, the symbols can have one of $2^n$ possible values. The data states include an erased state and one or more programmed states. A programmed state is a data state to which a memory cell is to be programmed in a programming operation. The symbol or data state which is to be represented by a cell is identified by one or more bits of write data in latches associated with the memory cell. This data state is the assigned data state. Each data state corresponds to a different range of threshold voltages (Vth). Moreover, a programmed state is a state which is reached by programming a memory cell so that its Vth increases from the Vth range of the erased state to a higher Vth range.

Based on its assigned data state, a memory cell will either remain in the erased state or be programmed to a programmed data state. For example, in a one bit per cell memory device, there are two data states including the erased state and a programmed state. In a two-bit per cell memory device, there are four data states including the erased state (S0) and three higher data states referred to as the S1, S2 and S3 data states (see FIG. 6A). In a three-bit per cell memory device, there are eight data states including the erased state and seven higher data states referred to as the S1, S2, S3, S4, S5, S6 and S7 data states (see FIG. 6B). In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states (see FIG. 6C) where S0 is the erased state.

Figure 7B:
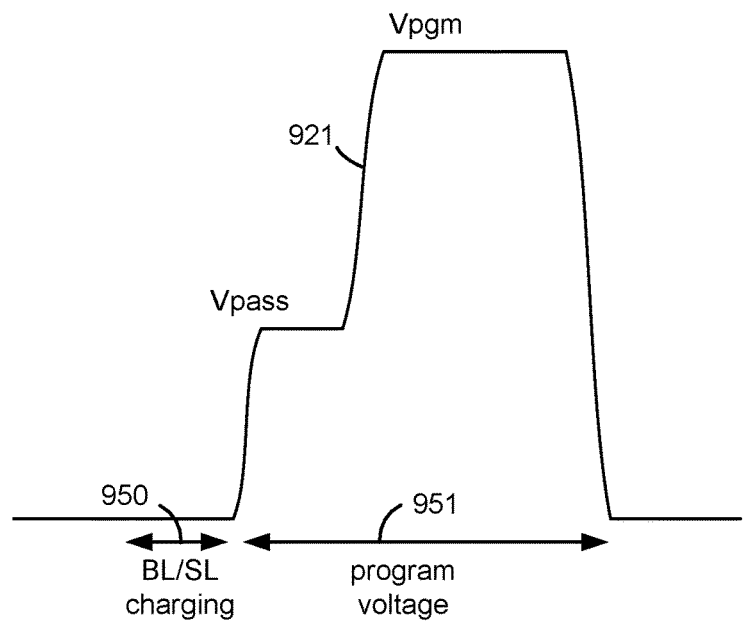
FIG. 7B depicts an example of the program voltage 921 of FIG. 7A and a preceding bit line and/or source line charging period.
Figure 7C:
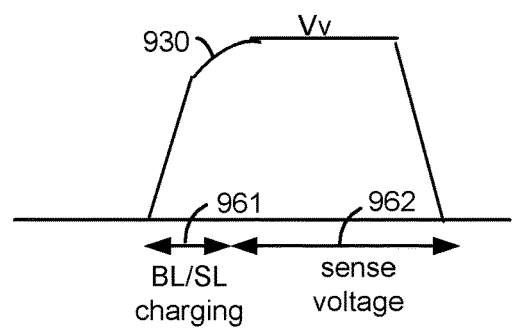
FIG. 7C depicts an example of the verify voltage 930 of FIG. 7C and a bit line and/or source line charging period.
Figure 7D:
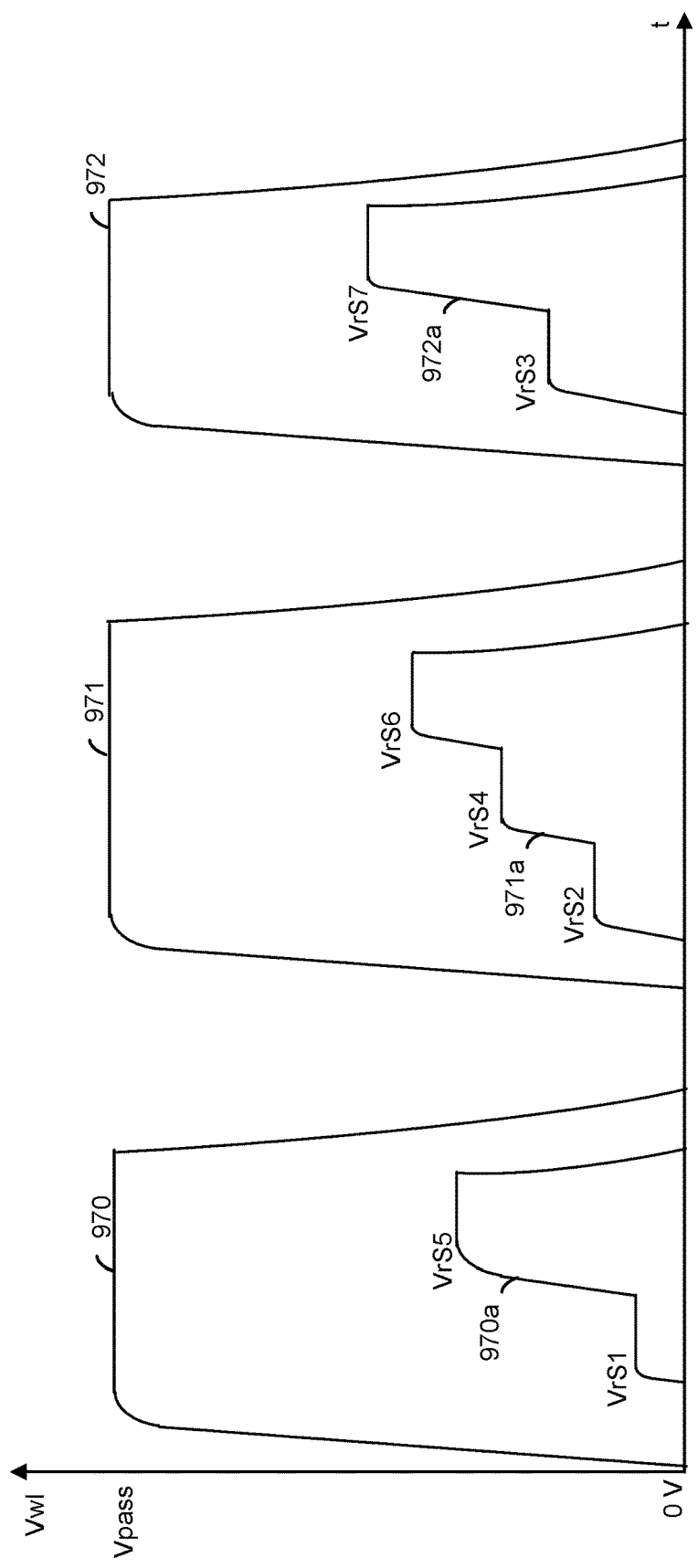
FIG. 7D depicts a plot of example waveforms in a read operation.

After the memory cells are programmed, the data can be read back in a read operation (see FIG. 7D). A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

A memory cell which is subject to programming and sensing operations can be biased at its drain, source and control gate. In some cases, a non-zero bias can be applied to the source and/or drain during a program voltage or a sense voltage. Moreover, the non-zero bias can vary over a wide range of several Volts at different times for a given cell or at a given time for different cells. Circuitry can provide the desired bias. For example, a transistor in a source-follower configuration can have its control gate voltage set at a level which produces a desired voltage at its source. The control gate voltage adjusts the amount of the drain voltage which is passed to the source.

The source of this voltage-setting transistor (see transistor 1010 in FIG. 10) can be connected to the source and/or drain of a memory cell. However, the peak source and/or drain voltage can be fairly high, e.g., up to a few volts, for instance. This requires application of a similarly high voltage to the control gate of the voltage-setting transistor. In some cases, this high voltage equals the desired source or drain voltage plus a threshold voltage of the voltage-setting transistor plus an overhead voltage or margin. The cost in terms of size and power increases as the voltage increases. Moreover, the threshold voltage of the transistor can vary based on its operating point.

Techniques provided herein address the above and other issues. In one approach, the peak voltage at which a voltage-setting transistor is driven is reduced. The voltage-setting transistor is driven at an initial level and then coupled higher by a capacitor which is connected to the control gate of the voltage-setting transistor. Moreover, the amount of coupling can vary based on the desired voltage at the source of the transistor. In some cases, the initial level and the amount of coupling up are a function of an assigned data state of a cell connected to the transistor. The capacitor may have a body which is common to a set of memory cells.

In one approach, one voltage-setting transistor sets a voltage at a drain terminal of a memory cell, e.g., by setting a voltage of bit line connected to the drain. At the same time, another voltage-setting transistor can set a voltage at a source of the memory cell, e.g., by setting a voltage of source line connected to the source terminal of the memory cell.

The voltage can be set prior to applying a program voltage to the control gate of a memory cell to control a programming speed of the memory cell based on its assigned data state. The voltage can also be set in connection with a sensing operation such as a verify or read operation.

Various other features and benefits are described below.

Figure 1:
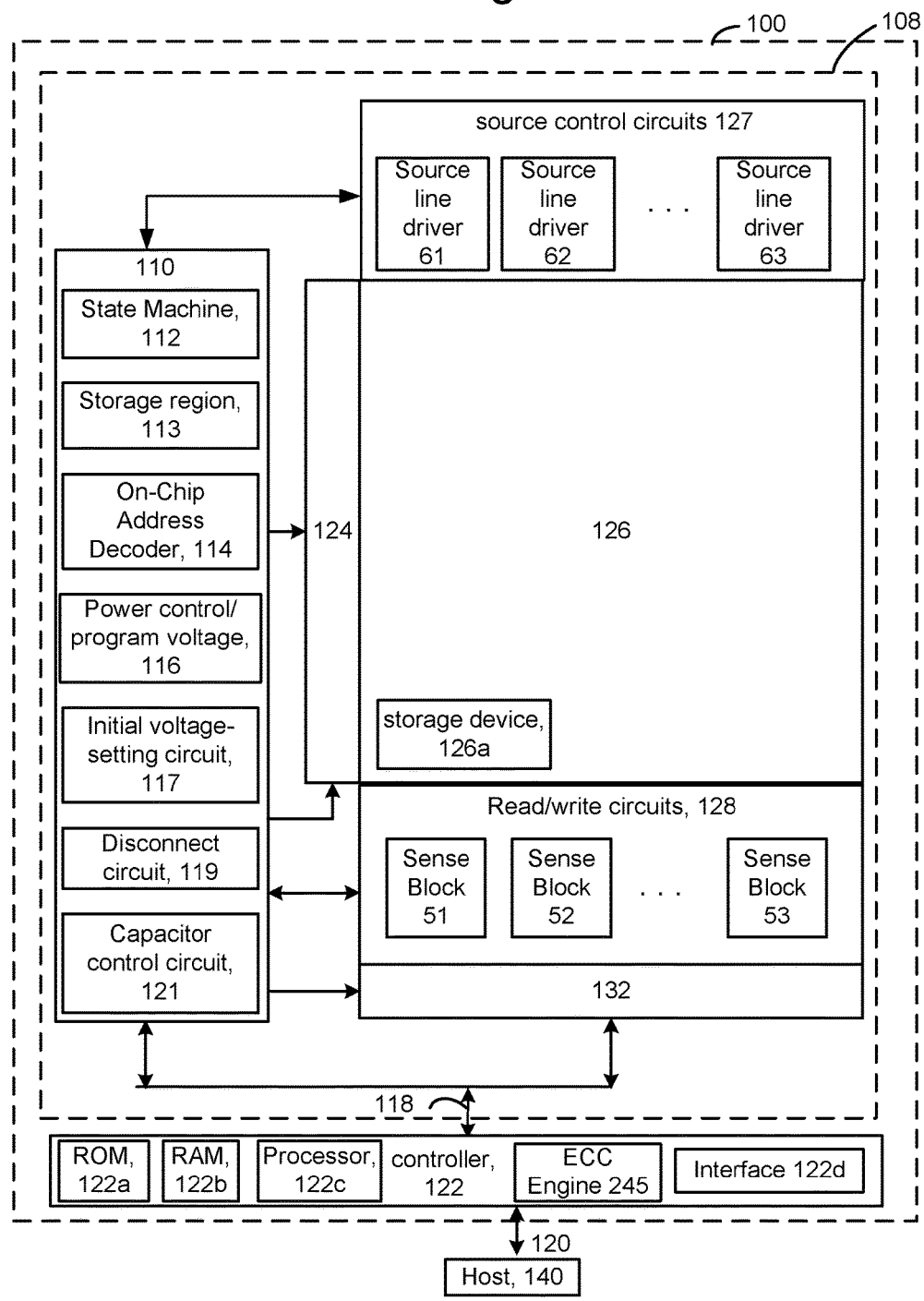
FIG. 1 is a block diagram of an example memory device.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Further details of the sense blocks including voltage sources and bit line decoders, are provided further below. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

In one approach, control circuitry 110 is also in communication with source control circuits 127, which includes source line driver 61, source line driver 62, . . . , source line circuit 63. The source line drivers are used to drive different (or the same) voltages on individual source lines. Further details of the source line drivers including voltage sources and source line decoders, are provided further below.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126. The control circuitry can include a state machine 112, a storage region 113, an on-chip address decoder 114, a power control/program voltage module 116, an initial voltage-setting circuit 117, a disconnect circuit 119, and a capacitor control circuit 121. The state machine 112 provides chip-level control of memory operations. The storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control/program voltage module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

The initial voltage-setting circuit 117 can be used to set the initial voltage of the control gate of a voltage-setting transistor. See, e.g., Vblg and Vblg_d in FIG. 12A. The disconnect circuit 119 can be used to disconnect the control gate of the voltage-setting transistor from a driven voltage waveform Vblg_d which provides Vblg. See, e.g., the transistor 1015 in FIG. 10. The capacitor control circuit 121 can be used to provide the voltage Vbody to the body of the capacitor 1020 in FIG. 10. See also FIGS. 14A and 14B. The initial voltage-setting circuit 117, disconnect circuit 119, and capacitor control circuit 121 can be used to implement the techniques described herein including the processes of FIG. 11A to 11C.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control/program voltage module 116, initial voltage-setting circuit 117, disconnect circuit 119, capacitor control circuit 121, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM")

devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
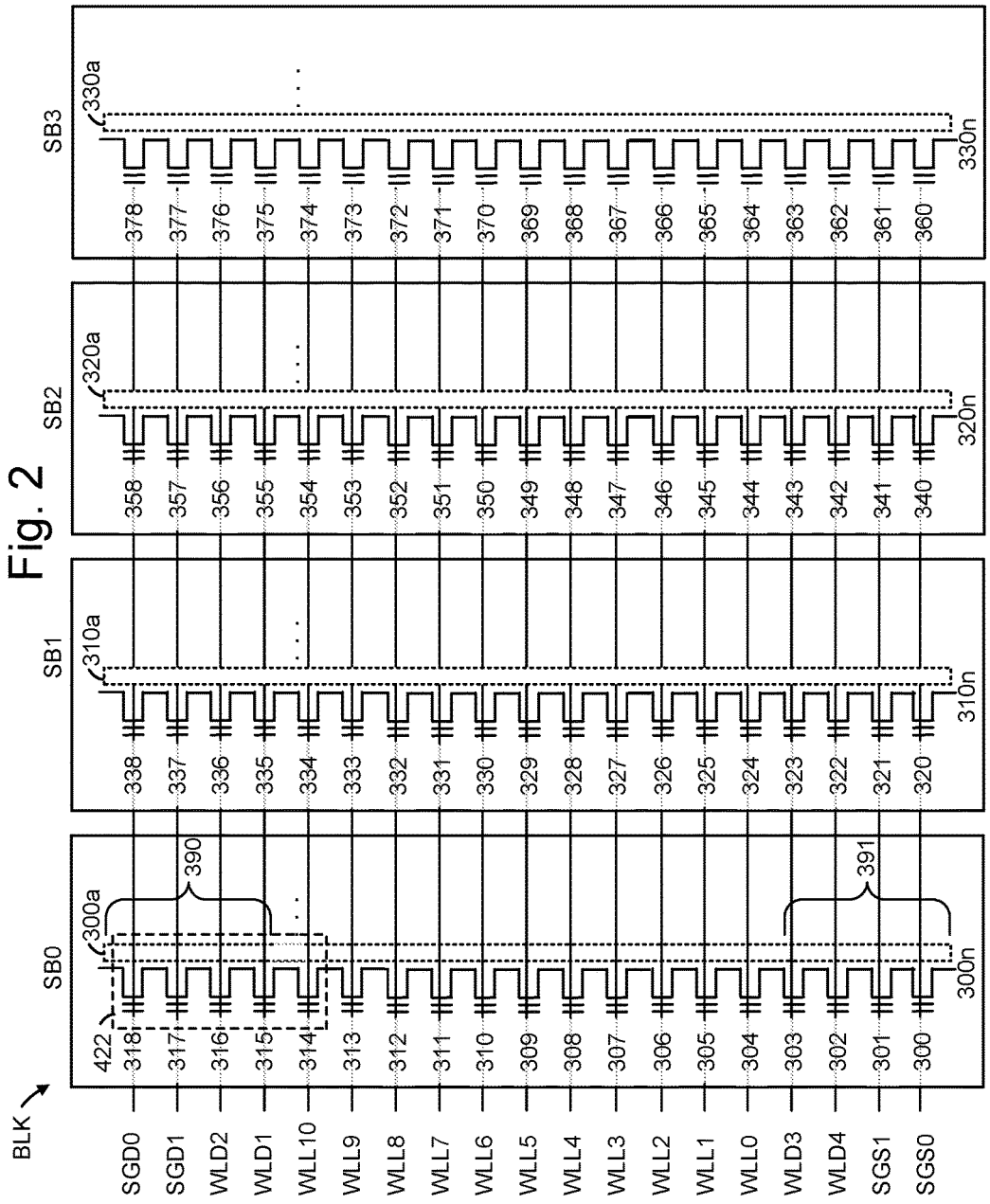
FIG. 2 depicts an example implementation of the memory structure 126 of FIG. 1 comprising NAND strings in sub-blocks in a 3D configuration.

FIG. 2 depicts an example implementation of the memory structure 126 of FIG. 1 comprising NAND strings in sub-blocks in a 3D configuration. In one approach, a block BLK of memory cells is formed from a stack of alternating conductive and dielectric layers. The block comprises conductive layers spaced apart vertically, and the conductive layers spaced apart vertically comprise word lines connected to the memory cells and select gate lines connected to SGD (drain-side select gate) and SGS (source-side select gate) transistors. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Each NAND string may be formed in a memory hole in the stack is filled with materials which form memory cells adjacent to the word lines. A region 422 of the stack is shown in greater detail in FIG. 3.

Further, each block can be divided into sub-blocks and each sub-block includes multiple NAND strings, where one example NAND string is depicted. For example, sub-blocks SB0, SB1, SB2 and SB3 comprise example NAND strings 300n, 310n, 320n and 330n, respectively. The NAND strings have data word lines, dummy word lines and select gate lines. Each sub-block comprises a set of NAND strings which extend in the x direction and which have a common SGD line. The NAND strings 300n, 310n, 320n and 330n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 300n, 310n, 320n and 330n have channels 300a, 310a, 320a and 330a, respectively. Each channel has a drain end and a source end. For example, the channel 300a has a drain end 390 and a source end 391.

Additionally, NAND string 300n includes SGS transistors 300 and 301, dummy memory cells 302 and 303, data memory cells 304, 305, 306, 307, 308, 309, 310, 311, 312, 313 and 314, dummy memory cells 315 and 316, and SGD transistors 317 and 318.

NAND string 310n includes SGS transistors 320 and 321, dummy memory cells 322 and 323, data memory cells 324, 325, 326, 327, 328, 329, 330, 331, 332, 333 and 334, dummy memory cells 335 and 336, and SGD transistors 337 and 338.

NAND string 320n includes SGS transistors 340 and 341, dummy memory cells 342 and 343, data memory cells 344, 345, 346, 347, 348, 349, 350, 351, 352, 353 and 354, dummy memory cells 355 and 356, and SGD transistors 357 and 358.

NAND string 330n includes SGS transistors 360 and 361, dummy memory cells 362 and 363, data memory cells 364, 365, 366, 367, 368, 369, 370, 371, 372, 373 and 374, dummy memory cells 375 and 376, and SGD transistors 377 and 378.

Figure 3:
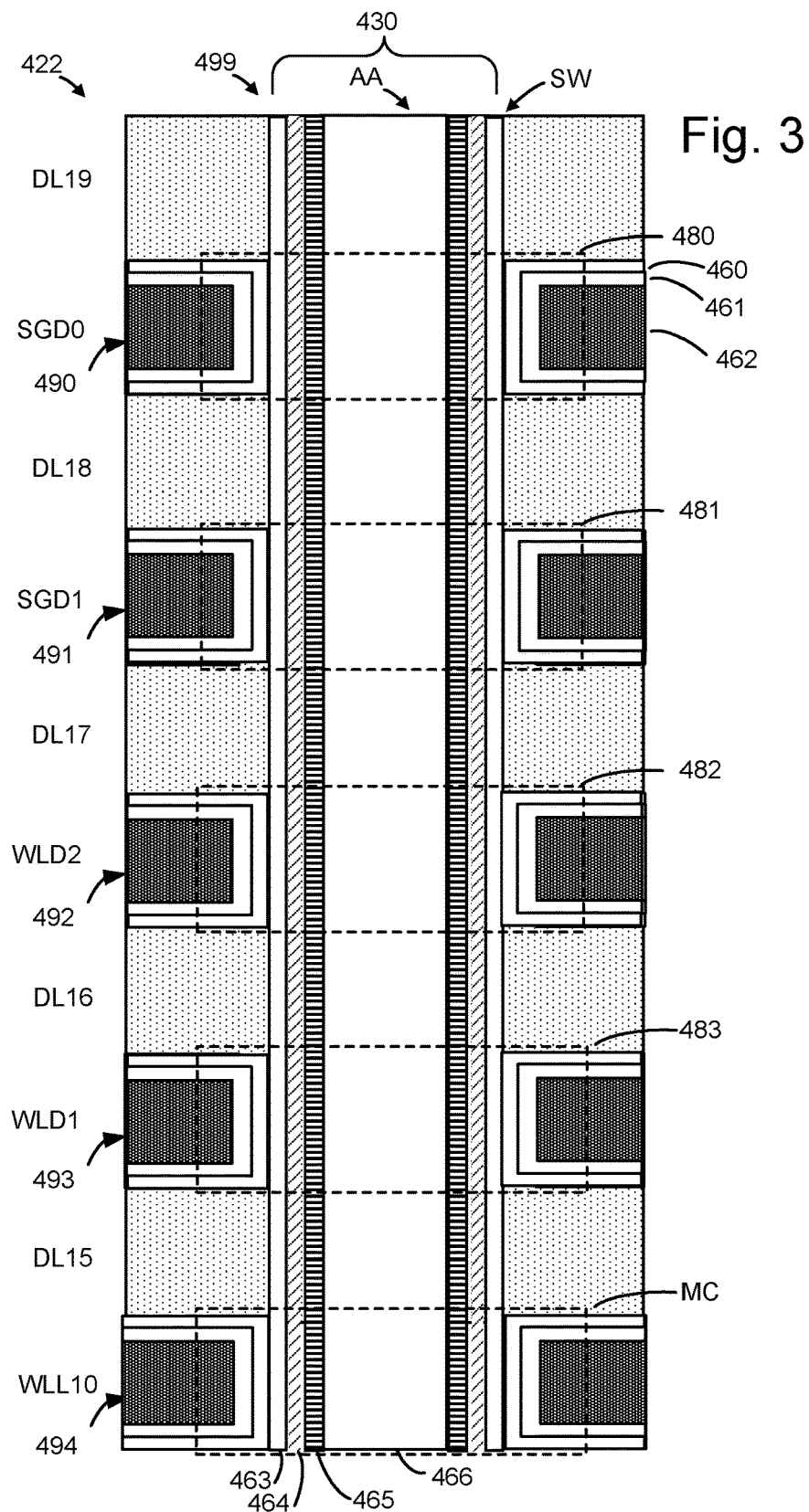
FIG. 3 depicts a close-up view of the region 422 of FIG. 2.

FIG. 3 depicts a close-up view of the region 422 of FIG. 2. Memory cells are formed at the different levels of the stack at the intersection of a word line layer and a memory hole. In this example, SGD transistors 480 and 481 are provided above dummy memory cells 482 and 483 and a data memory cell MC. A number of layers can be deposited along the sidewall (SW) of the memory hole 430 and/or within each word line layer, e.g., using atomic layer deposition. For example, each pillar 499 or column which is formed by the materials within a memory hole can include a charge-trapping layer 463 or film such as silicon nitride ($Si_3N_4$) or other nitride, a tunneling layer 464, a channel 465 (e.g., comprising polysilicon), and a dielectric core 466. A word line layer can include a blocking oxide/block high-k material 460, a metal barrier 461, and a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 4:
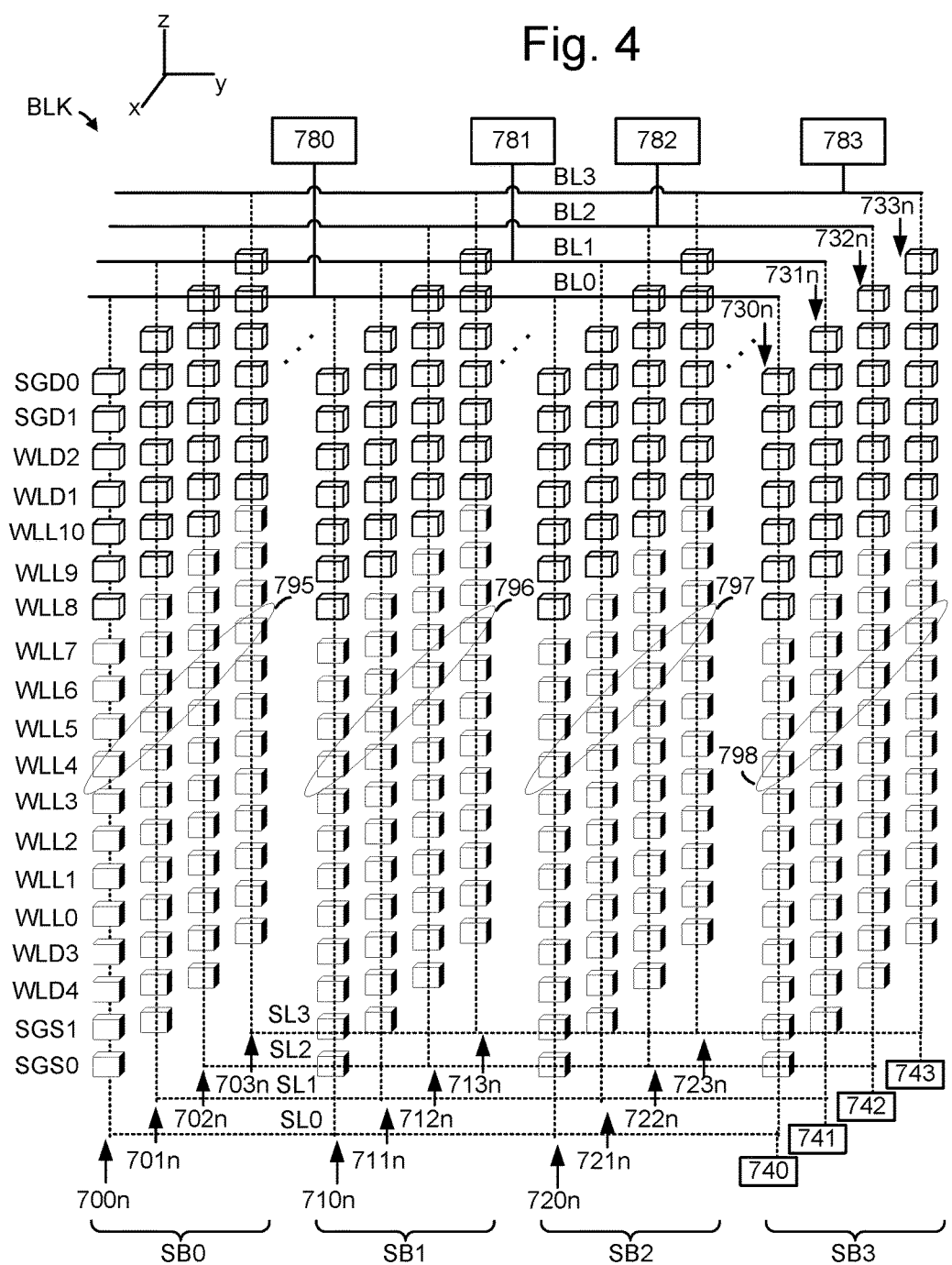
FIG. 4 depicts additional detail of the sub-blocks SB0-SB3 of FIG. 2, in a configuration where the source lines are separate.

FIG. 4 depicts additional detail of the sub-blocks SB0-SB3 of FIG. 2, in a configuration where the source lines are separate. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sensing circuitry may be connected to each bit line. For example, sensing circuitry 780, 781, 782 and 783 is connected to bit lines BL0, BL1, BL2 and BL3. A bit line voltage source including a voltage-setting transistor may be provided with the sensing circuitry.

Programming and reading can occur for selected cells in one word line and one sub-block at a time. This allows each selected cell to be controlled by a respective bit line and/or source line. For example, an example set 795 of memory cells in SB0 is connected to WLL4. Similarly, the sets 796, 797 and 798 comprise data memory cells in SB1, SB2 and SB3 connected to WLL4. In this example, the source lines SL0-SL3 are separate from one another and are driven at respective voltages by voltage sources 740-743, respectively. Each voltage source may include a voltage-setting transistor such as in FIG. 10 and as described herein.

In another approach, the source lines are connected to one another and driven by a common voltage source.

FIG. 5 depicts an example memory cell 790. The memory cell comprises a control gate CG which receives a word line voltage Vwl, a drain at a voltage Vd, a source at a voltage Vs and a channel at a voltage Vch.

FIG. 6A depicts an example Vth distribution of memory cells, where four data states are used. The data states are represented by Vth distributions 810, 811, 812 and 813 for the S0 (erased), S1, S2 and S3 states, respectively. The optimum read voltages generally are midway between the Vth distributions of adjacent data states. The read voltages for the S1, S2 and S3 states are VrS0, VrS1 and VrS2, respectively. During a programming operation, separate verify voltages, e.g., VvS0, VvS1 and VvS2, may be used. In another approach (see FIG. 7A), a single verify voltage is used which is common to the different assigned data states.

Each read voltage demarcates a lower boundary of a data state of a plurality of data states. For example, VrS0 demarcates a lower boundary of the S0 state.

An example encoding of bits for each state is 11, 10, 00 and 01, respectively, in the format of upper page (UP) bit/lower page (LP) bit. A LP read may use VrS1 and VrS3 and an UP read may use VrS2. A lower or upper bit can represent data of a lower or upper page, respectively. With these bit sequences, the data of the lower page can be determined by reading the memory cells using read voltages of VrS1 and VrS3. The lower page (LP) bit=1 if Vth<=VrS1 or Vth>VrS3. LP=0 if VrS1<Vth<=VrS3. The upper page (UP) bit=1 if Vth<=VrS2 and LP=0 if Vth>VrS2. In this case, the UP is an example of a page which can be determined by reading using one read voltage applied to a selected word line. The UP is an example of a page which can be determined by reading using two read voltages applied to a selected word line.

FIG. 6B depicts an example Vth distribution of memory cells, where eight data states are used. The S0-S7 states have Vth distributions 820-827, respectively. For the S1-S7 states, we have verify voltages VvS1-VvS7, respectively, in one possible approach. In another approach (see FIG. 7A), a single verify voltage is used which is common to the different assigned data states. For the S1-S7 states, we have read voltages VrS1-VrS7, respectively, and example encoding of bits of 111, 110, 100, 000, 010, 011, 001 and 101, respectively. The bit format is: UP/MP/LP.

FIG. 6C depicts an example Vth distribution of memory cells, where sixteen data states are used. Programming using four bits per cell (16 levels) can involve lower, lower-middle, upper-middle and upper pages. The data states are represented by Vth distributions 830-845 for the S0-S15 states, respectively, and an example encoding of bits for each state is 1111, 1110, 1100, 1101, 1001, 1000, 1010, 1011, 0011, 0010, 0000, 0100, 0110, 0111, 0101 and 0001, respectively, in the format of upper page (UP) bit/upper middle (UMP) page bit, lower middle (LMP) page bit, lower page (LP) bit. The verify voltages are VvS1-VvS15 in one possible approach. The read voltages are VrS1-VrS15 for states S1-S15, respectively.

A LP read may use VrS1, VrS3, VrS5, VrS7, VrS9 and VrS13. A LMP read may use VrS2, VrS6, VrS10, VrS12 and VrS14. An UMP read may use VrS4, VrS11 and VrS15. An UP read may use VrS8.

FIG. 7A depicts a waveform 920 of an example programming operation, where one verify voltage is applied for verifying different data states. A series of program voltages 921, 922, 923, 924, 925 and 926 are applied to a word line. The number of program voltages used to complete programming of a page of data is smaller than in other approaches because non-zero source line and/or bit line voltages are used to adjust the programming speeds of the different cells. In particular, the source line and/or bit line voltages for the lower state cells are elevated to reduce their programming speed while the higher state cells are allowed to have a higher programming speed to reach their assigned states at about the same time as the lower state cells. Moreover, a single verify voltage, such as verify voltage 930, can be used to verify different data states concurrently. As a result, programming time is significantly reduced. See further details below, e.g., in connection with FIGS. 8A to 8E, 9A and 9B.

FIG. 7B depicts an example of the program voltage 921 of FIG. 7A and a preceding bit line and/or source line charging period. The program voltage may be applied to a set of memory cells connected to a selected word line. In the set, some of the cells are biased at their bit line and/or source line to allow programming and some may be biased to inhibit programming. Moreover, as mentioned, of the cells being programmed, the bit line and/or source line voltages can be elevated from 0 V to control the programming speed based on their assigned data state.

The program voltage may initially step up to an intermediate level, Vpass, before stepping up to its peak level, Vpgm, in a program voltage time period 951. A time period 950 can be for charging up or setting the bit line (BL) and/or source line (SL) voltages to respective non-zero, positive levels. Generally, it is desirable for these voltages to be set before the program voltage is applied since the BL/SL voltages control the programming speed of the respective memory cell to which the bit line and source line are connected. Optionally, the charge up period could overlap with the program voltage, at the start of the time period 951. Performing the charge up while the program voltage is at Vpass could be acceptable since Vpass does not have a strong programming effect.

The programming speed of a cell refers, e.g., to the increase in its Vth for a given increase in the program voltage, or to a rate of increase in Vth for a given rate of increase of the program voltage.

FIG. 7C depicts an example of the verify voltage 930 of FIG. 7C and a bit line and/or source line charging period. As mentioned, a single verify voltage can be used to verify memory cells relative to different threshold voltages when the source and/or drain of the memory cells are appropriately biased. See, e.g., FIGS. 9A and 9B. In one approach, the charging up of the bit line and/or source line occurs at the start of the ramp up of the verify voltage, in a time period 961. The sense voltage reaches its peak level Vv in a remaining time period 962. This option avoids using extra time for the charging up. However, it is possible to perform the charging up just prior to the ramp up of the verify voltage. The verify voltage may be applied to a set of memory cells connected to a selected word line. In the set, some of the cells which have not yet completed programming and reached the inhibit condition are sensed while other cells which have completed programming or which are to remain in the erased state are not sensed.

FIG. 7D depicts a plot of example waveforms in a read operation. A read operation may involve reading a number of pages of data—three pages in this example. A control gate read voltage is applied to a selected word line while a pass voltage, Vpass, is applied to the remaining unselected word lines. A sense circuit is then used to determine whether a cell is in a conductive state. Vpass is ramped up and then back down separately during the read voltages of each of the lower, middle and upper pages as depicted by plots 970, 971 and 972, respectively. This example is for an eight-state memory device. The example can be modified for fewer states (e.g., four states and two pages) or additional states (e.g., sixteen states and four pages).

For the first page, the S0 and S5 states are read using a read voltage waveform 970a having voltages of VrS0 and VrS5, respectively. For the second page, the S2, S4 and S6 states are read using a read voltage waveform 971a having voltages of VrS2, VrS4 and VrS6, respectively. For the third page, the S3 and S7 states are read using a read voltage waveform 972a having voltages of VrS3 and VrS7, respectively. Optionally, the bit line and/or source line can be charged up in a read operation. The charging up can occur during the ramp up of each sense voltage, for instance, similar to FIG. 7C.

FIG. 8A to 8E depict threshold voltages distributions during an example programming operation consistent with the waveform of FIG. 7A. This is an example of a multi-state programming operation in which the non-volatile memory cells are programmed to a plurality of assigned data states.

FIG. 8A depicts the results of applying the first program voltage 921 in FIG. 7A. FIG. 8A shows the target or final Vth distributions in solid lines and the current Vth distributions in dashed lines. Vth distributions 1102, 1104, 1106, 1108, 1110, 1112 and 1114 are for memory cells being programmed to assigned data states S1, S2, S3, S4, S5, S6 and S7, respectively. The Vth distribution 1100 is for the erased state S0. Note that the height/magnitude of the Vth distributions 1102, 1104, 1106, 1108, 1110, 1112 and 1114 is somewhat exaggerated to make the drawings easier to read.

FIG. 8B depicts the results of applying the second program voltage 922 in FIG. 7A. Vth distributions 1102a, 1104a, 1106a, 1108a, 1110a, 1112a and 1114a are for memory cells being programmed to assigned data states S1, S2, S3, S4, S5, S6 and S7, respectively.

FIG. 8C depicts the results of applying the third program voltage 923 in FIG. 7A. As depicted, Vth distributions 1102b, 1104b, 1106b, 1108b, 1110b, 1112b and 1114b are for memory cells being programmed to assigned data states S1, S2, S3, S4, S5, S6 and S7, respectively.

FIG. 8D depicts the results of applying the fourth program voltage 924 in FIG. 7A. As depicted, Vth distributions 1102c, 1104c, 1106c, 1108c, 1110c, 1112c and 1114c are for memory cells being programmed to assigned data states S1, S2, S3, S4, S5, S6 and S7, respectively.

FIG. 8E depicts the results of applying the fifth program voltage 925 in FIG. 7A. As depicted, Vth distributions 1102d, 1104d, 1106d, 1108d, 1110d, 1112d and 1114d are for memory cells being programmed to assigned data states S1, S2, S3, S4, S5, S6 and S7, respectively. After the sixth program voltage 926, the Vth distributions 1102e, 1104e, 1106e, 1108e, 1110e, 1112e and 1114e are reached.

In this programming operation, the bit line and/or source line voltages are controlled for each cell based on the assigned data state of the cell. The bit line and/or source lines can be pre-charged as discussed herein. For each assigned data state, some of the cells will complete programming after the first program voltage. These are the fast programming cells. The slower programming cells will complete programming as the additional program voltages are applied.

FIG. 9A is a table that identifies one embodiment of data dependent bit line voltages for programming, verifying and reading, consistent with FIG. 7A to 8E. The source line voltages can be the same or similar, in one approach. The programming operation of FIG. 7A includes applying data dependent voltages to individual source and/or bit lines for programming. The column labelled "State" depicts the assigned data state.

The column labelled "Program" identifies the data dependent voltages applied to individual bit line during a program voltage on the control gate or word line. For example, for memory cells being programmed to state S1, S2, S3, S4, S5, S6, S7 or S8, the bit line voltages (Vbl) are 2.6, 2.2, 1.8, 1.4, 1.0, 0.6 and 0.2, respectively. For memory cells which remain in the erased state S0 or are in the inhibit state, the bit line voltages are 3.0 V. Once a decision has been made based on one of the verify operations to lock out any particular cell from further programming (due to the Vth of a cell exceeding its verify voltage), then from that point on the cell/column will be treated the same way as an erased cell. That is, it will be locked out of further programming by boosting or other methods that inhibit programming.

Because memory cells being programmed to lower states receive higher source line and/or bit line voltages, the programming pulses will cause the Vth of these memory cells to increase at a lower rate, consistent with FIG. 8A to 8E. Similarly, because memory cells being verified for lower states receive higher source line voltages and bit line voltages, the verification test can use the same single verification voltage on the selected word line.

The column labelled "Inhibit" identifies a voltage (e.g., 3.0 V) applied to individual bit lines of memory cell which have an inhibit, e.g., lockout, status. This includes cells erased state cells and cells which have completed programming and are inhibited from further programming. This is for an eight-state example and can be modified for other numbers of data states.

The column labelled "Verify" identifies the data dependent voltages applied to individual source and/or bit lines, respectively, during a verify voltage on the control gate or word line. In this example, the Vbl during a verify voltage is the same as the Vbl during a program voltage, for each data state.

The column labelled "Read" identifies the voltage applied to individual bit lines during a read voltage on the control gate or word line. In this example, the bit line voltage is 0 V for cells of all data states.

FIG. 9B is a table that provides example voltages for the drain side select signal (Vsgd), source side select signal (Vsgs), selected word line (WL N), unselected word lines on the source side of the selected word line (WL#≤N−1), where WL# is a word line number, and unselected word lines on the drain side of the selected word line (WL#≥N+1), consistent with FIG. 7A to 8E.

During programming, the selected word line receives Vpgm (see FIG. 7A), while the unselected word lines on the drain side and source side receive 6.0 V, and the source and drain side select lines receive 3.0 V.

During a verify test, the selected word line receives 3.0 V, while the unselected word lines on the drain side receive 3.5 V, the unselected word lines on the source side receive 8.0 V, and the source and drain side select lines receive 5.0 V.

During reading, the selected word line receive a control gate read voltage, Vcgr (e.g., VrS0-VrS7 in FIG. 6B), the source and drain side select lines are 2.5 V, and the source and drain side unselected word lines receive 4.0 V. Note that the numerical values listed in FIGS. 9A and 9B are examples, and other values can also be used. Engineering optimization will determine the best voltages to apply during program, read and verify. Other operations can be included as well such as erase.

FIG. 10 depicts an example circuit 1000 which is used to provide different bit line and/or source line voltages such as in FIG. 9A. The circuit includes a voltage-setting transistor 1010 comprising a control gate 1011, drain 1007, source 1009 and body 1008. The drain of the transistor receives a voltage from a voltage source Vs via a transistor 1006 when the transistor 1006 is conductive and passes Vs to the transistor 1010. The control gate is connected to a path 1012 which in turn is connected to one terminal 1021 of a capacitor 1020. Another terminal 1022 of the capacitor comprise a body of the capacitor. The capacitor body is driven at a voltage Vbody and may be shared by multiple circuits similar to the circuit 1000. See FIG. 15. The transistor 1010 may be biased in a source-follower configuration so that the source voltage follows the control gate voltage. In particular, the source voltage is equal to the control gate voltage (Vblg) minus a threshold voltage (Vth) of the transistor 1010 minus an overhead voltage such as 0.2 V.

An isolation transistor 1015 receives a voltage Viso at its control gate. When this transistor is conductive, it passes a voltage Vblg_d on a path 1013 to the path 1012 and the control gate 1011. A grounding transistor grounding can connect the path 1012 and the control gate 1011 to ground (0 V) when it is in a conductive state.

A path 1005 may be a sense node which is used during a sensing operation. The sense node can be connected to latches 1030 via a transistor 1004 which store a result of the sensing. A clamping transistor 1002 can be used to clamp a voltage of a bit line 1003 or source line during sensing. Vbl denotes the bit line voltage.

As noted at FIG. 9A, for example, Vbl may be set to a range of voltages, e.g., from 0-3.0 V during program or verify. At the higher voltage, e.g., 3.0 V, in one approach, Vblg is set to 3.0+Vth+0.2 V. The Vth of the voltage-setting transistor can vary over a range of operating conditions due to the body effect. The body effect refers to a change in the Vth resulting from a change in the source-to-body voltage. The Vth is generally higher when the source-to-body voltage is higher. Since the source voltage is the same as the bit line and/or source line voltage, Vth is higher when the bit line and/or source line voltage is higher. Assume Vth varies from 0.9-1.6 V. Thus, Vth=1.6 V when the transistor is biased at its highest level for an S7 state cell. In this case, Vblg=3.0+ 1.6+0.2=4.8 V. As another example, Vth=0.9 V when the transistor is biased at its lowest level for an S0 state or inhibited cell. In this case, Vblg=0.2+0.9+0.2=1.3 V. See also FIG. 12A to 12C.

Figure 11A:
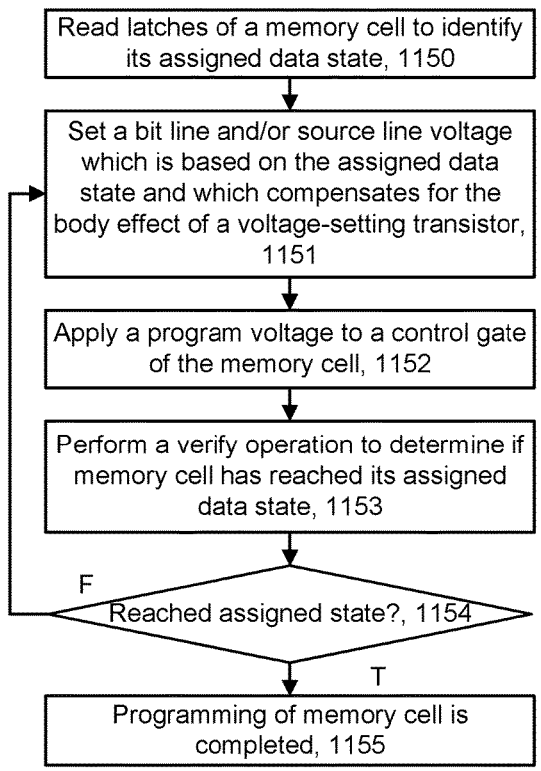
FIG. 11A depicts a process for programming a memory cell which compensates for the body effect of the voltage-setting transistor 1010 of FIG. 10.
Figure 11B:
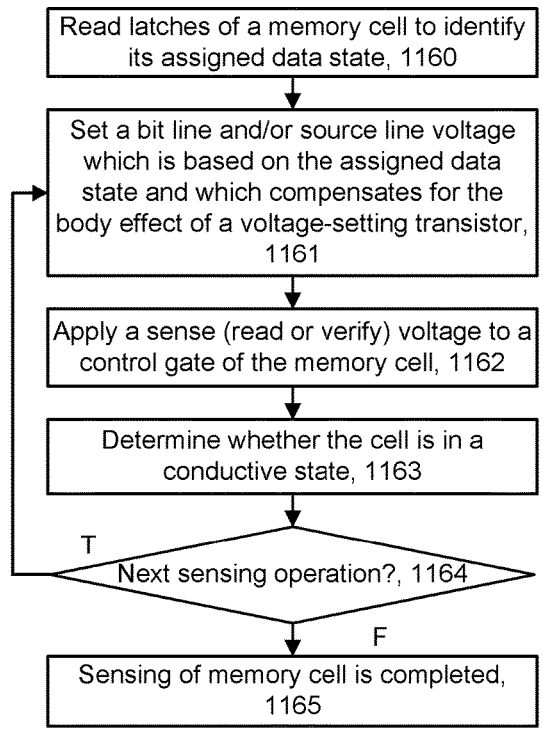
FIG. 11B depicts a process for sensing a memory cell which compensates for the body effect of the voltage-setting transistor 1010 of FIG. 10.
Figure 11C:
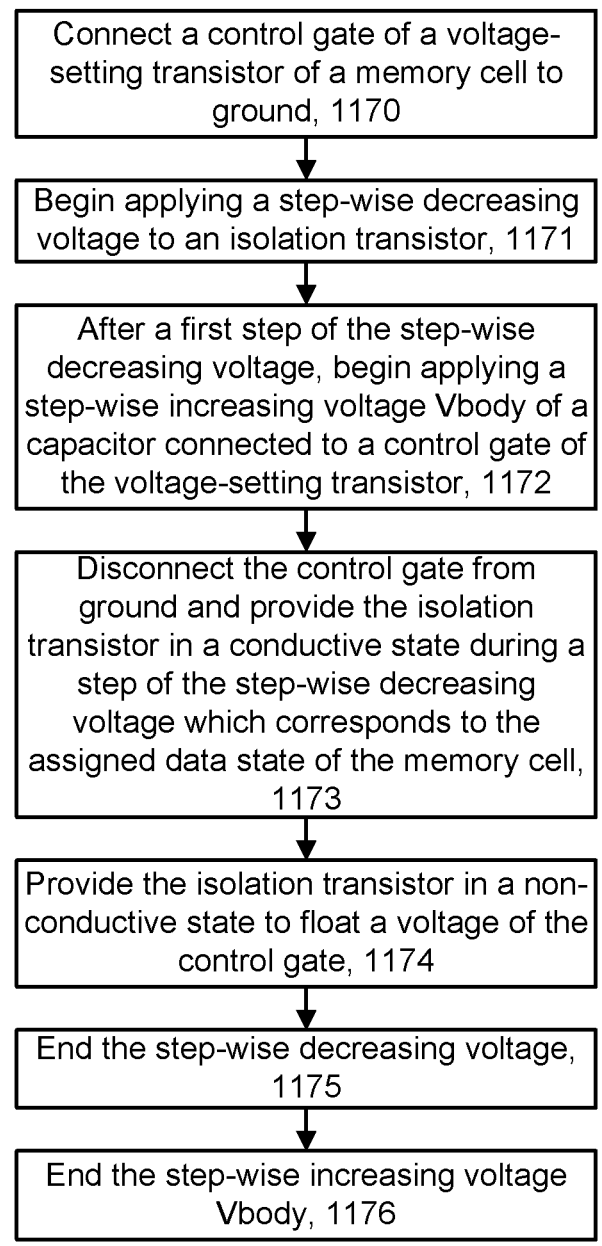
FIG. 11C depicts a process for applying a bit line and/or source line voltage consistent with step 1151 of FIG. 11A.

As mentioned at the outset, there is a cost in terms of size and power consumption in setting the peak control gate voltage (Vblg) for the voltage-setting transistor. The techniques provided herein reduce the peak driven level of Vblg_d to reduce these costs. The techniques also compensate for the body effect of the voltage-setting transistor so that the bit line and/or source line voltage can be set more accurately. FIG. 11A to 11C provide example processes to implement the techniques.

FIG. 11A depicts a process for programming a memory cell which compensates for the body effect of the voltage-setting transistor 1010 of FIG. 10. Step 1150 includes reading latches of a memory cell to identify its assigned data state. The latches can be provided in a sense circuit connected to a string of memory cells, for instance. Step 1151 includes setting a bit line and/or source line voltage which is based on the assigned data state and which compensates for the body effect of a voltage-setting transistor. Step 1152 includes applying a program voltage to a control gate of the memory cell, e.g., via a selected word line which is connected to a set of selected memory cells. The program voltage is applied while the voltage-setting transistor is biased at a desired elevated level. Step 1153 includes performing a verify operation to determine if the memory cell has reached its assigned data state. A decision step 1154 is true if the cell has reached its assigned data state and false if it has not reached its assigned data state. Programming of the memory cell is complete at step 1155 if decision step 1154 is true. If decision step 1154 is false, another program loop is performed starting at step 1151. The program voltage may also be stepped up in each program loop as depicted in FIG. 7A.

FIG. 11B depicts a process for sensing a memory cell which compensates for the body effect of the voltage-setting transistor 1010 of FIG. 10. Step 1160 includes reading latches of a memory cell to identify its assigned data state. Step 1161 includes setting a bit line and/or source line voltage which is based on the assigned data state and which compensates for the body effect of a voltage-setting transistor. Step 1162 includes applying a sense (read or verify) voltage to a control gate of the memory cell, e.g., via a selected word line which is connected to a set of selected memory cells. The sense voltage is applied while the voltage-setting transistor is biased at a desired level. Step 1163 includes performing a sensing operation to determine if the memory cell is in a conductive state. A decision step 1164 is true if there is a next sensing operation. In this case, steps 1161-1163 are repeated. If decision step 1164 is false, sensing of the memory cell is completed at step 1165.

FIG. 11C depicts a process for applying a bit line and/or source line voltage consistent with step 1151 of FIG. 11A. Step 1170 includes connecting a control gate of a voltage-setting transistor 1010 of a memory cell to ground. For example, the grounding transistor 1014 may be made conductive to ground the path 1012. Step 1171 includes beginning to applying a step-wise decreasing voltage to the isolation transistor 1015. See plot 1200 in FIG. 12A. Step 1172 includes, after a first step (plot 1200i at t0-t1) of the step-wise decreasing voltage, beginning (at time t1) the applying of a step-wise increasing voltage Vbody of the capacitor 1020. See plot 1210 in FIG. 12A. Step 1173 includes disconnecting the control gate from ground (by making the grounding transistor 1014 non-conductive for the duration of one of the pulses in FIG. 13) and, at the same time, providing the isolation transistor in a conductive state (by making the isolation transistor 1015 conductive) during a step of the step-wise decreasing voltage (FIG. 12A) which corresponds to the assigned data state of the memory cell.

Figure 12A:
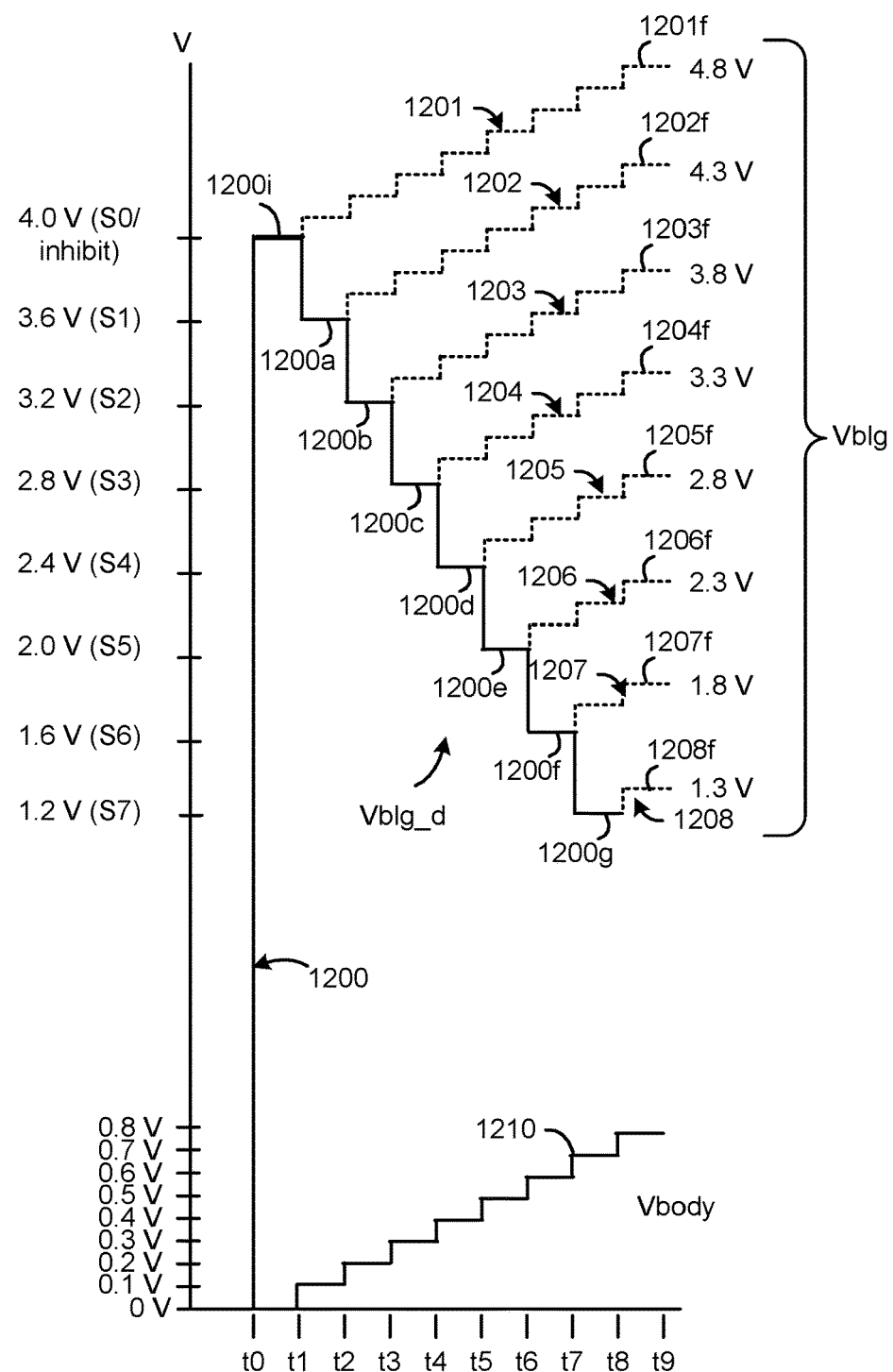
FIG. 12A depicts a plot of Vblg, the control gate voltage of the voltage-setting transistor 1010 of FIG. 10, Vblg_d, the driven voltage on path 1013, and Vbody, the voltage of the body of the capacitor 1020 in FIG. 10, consistent with the process of FIG. 11C.
Figure 13:
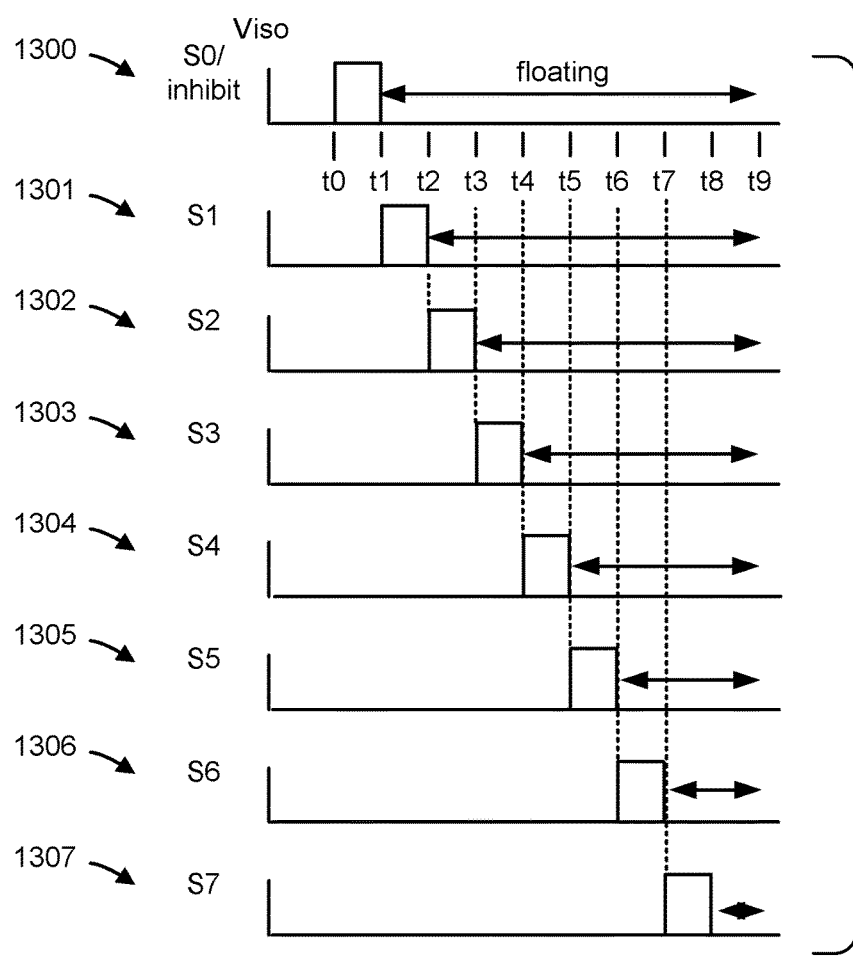
FIG. 13 depicts an example control signal for the isolation transistor 1015 of FIG. 10, consistent with FIGS. 12A and 12B.

For example, in FIG. 12A, the isolation transistor can be provided in a conductive state from t1-t2, t2-t3, t3-t4, t4-t5, t5-t6, t6-t7 and t7-t8 during steps 1200a, 1200b, 1200c, 1200d, 1200e, 1200f and 1200g, respectively, for memory cells assigned to the S0-S7 states, respectively. See also FIG. 13 which shows voltage pulses which place the different isolation transistors for cells of different assigned states in a conductive state at various times. The isolation transistor can be provided in a non-conductive state at other times. Step 1174 includes providing the isolation transistor in a non-conductive state to float a voltage (Vblg) of the control gate. For example, FIG. 13 shows time periods in which the control gate voltages of the voltage-setting transistors are floated based on the data state. Step 1175 ends the step-wise decreasing voltage, Vblg. Step 1176 ends the step-wise increasing voltage, Vbody.

Figure 12B:
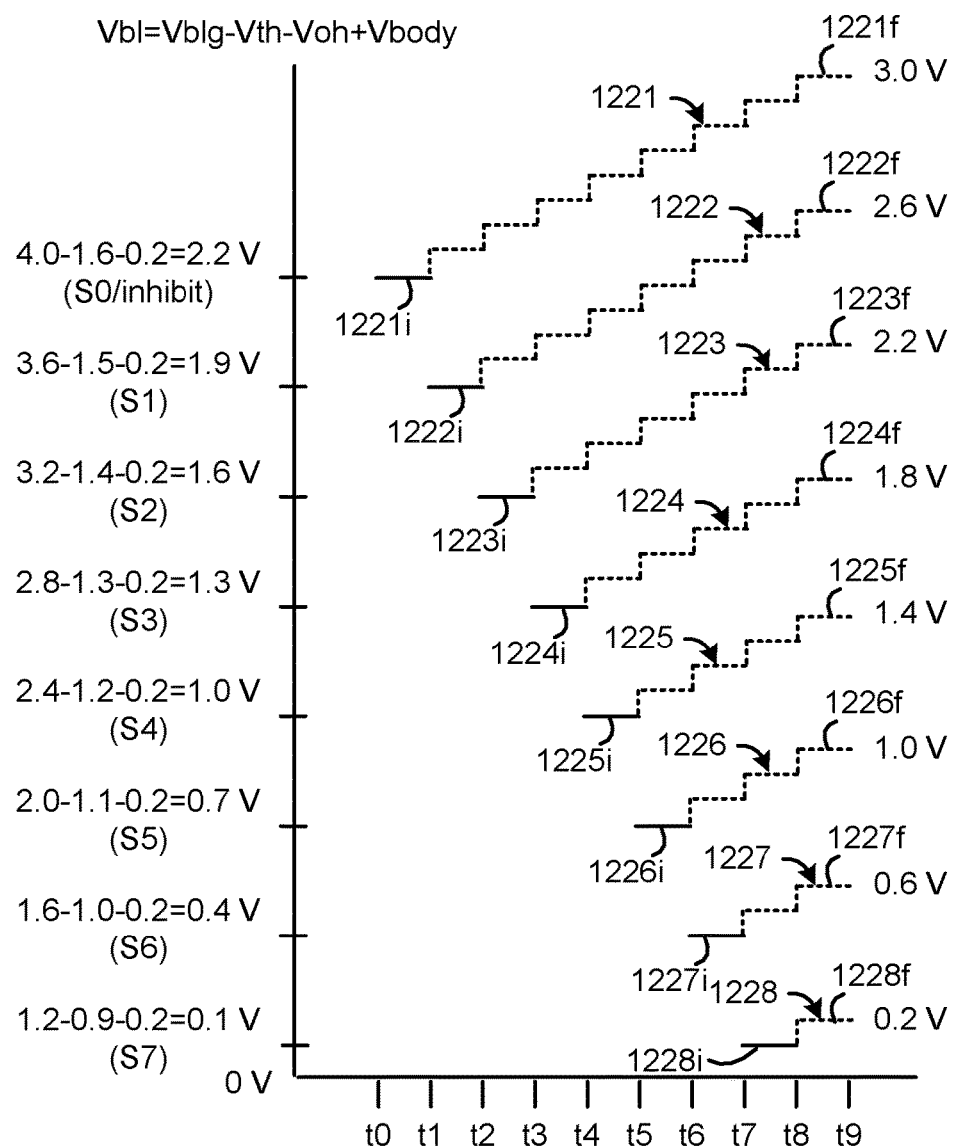
FIG. 12B depicts a plot of bit line voltage Vbl, consistent with FIG. 12A and the process of FIG. 11C.

FIG. 12A depicts a plot of Vblg, the control gate voltage of the voltage-setting transistor 1010 of FIG. 10, Vblg_d, the driven voltage on path 1013, and Vbody, the voltage of the body of the capacitor 1020 in FIG. 10, consistent with the process of FIG. 11C. In FIGS. 12A and 12B, the vertical axis depicts voltage and the horizontal axis depicts time. Plot 1200 is an example of a step-wise decreasing waveform. It reaches a peak level of plot 1200i and then decreases in steps of 0.4 V in this example. Steps 1200a-1200g represent Vblg_d and an initial level of Vblg for memory cells assigned to the S0-S7 states, respectively. The plots 1201-1208 represent an increase in Vblg due to capacitive coupling from the capacitor 1020 for memory cells assigned to the S0-S7 states, respectively. Vblg increases to a final level represented by plots 1201f-1208f for states S0-S7, respectively. The plots 1201-1208 represent elevated levels of Vblg above the initial levels.

As mentioned, the memory cells in the inhibit state are treated the same as the cells assigned to the S0 state. Vblg can float higher as Vbody is increased due to capacitive coupling of the capacitor body to the path 1012. This occurs without increasing Vblg_d.

Generally, the increase due to capacitive coupling is higher for cells assigned to lower data states. For these cells, the programming speed should be relatively low so that the bit line and/or source line voltage should be relatively high, in one embodiment. The technique allows a specified value of Vblg to be achieved without driving the path 1012 at that level. Instead, the path can be driven at a lower level which sets an initial voltage and then floated and coupled higher.

The plot 1210 shows that Vbody is increased in steps. Vbody could also be ramped up ore gradually. Vbody begins at 0 V and increases to 0.8 V in this example. The range of increase of Vbody may be similar to the range of the Vth of the voltage-setting transistor under different operating conditions. In a previous example, it was mentioned that Vth could vary from 0.9-1.6 V. The plot 1210 has eight steps, one for each state, in this example. In another example, one option, Vblg is not floated higher for the S0 state in which case the plot 1210 could have seven steps. These examples can be modified for more than, or fewer than, eight data states.

The example assume that the body effect is fairly linear so that the steps sizes are equal. However, unequal step sizes could be used instead for plot 1200 and/or 1210.

The technique allows Vblg to be set optimally for different bit lines and/or source lines (e.g., control lines) at the same time, where each bit line and/or source line is associated with a different respective capacitor, but the capacitors may have a common body terminal such as a region of a substrate on which the circuits are formed.

FIG. 12B depicts a plot of bit line voltage Vbl, consistent with FIG. 12A and the process of FIG. 11C. Vbl is calculated as Vbl=Vblg–Vth–Voh (overhead voltage, e.g., 0.2 V). A similar approach can be used for the source line voltage. Plots 1221-1228i represent the initial level of Vbl which is set for data states S0-S7, respectively. Plots 1221-1228 represent an increase in Vbl and reach a final, peak level of 1221f-1228f for states S0-S7, respectively. For S0, Vbl is set at 4.0 V, Vth=1.6 V and Vbl=4.0–1.6–0.2=2.2 V. For S1, Vbl is set at 3.6 V, Vth=1.5 V and Vbl=3.6–1.5–0.2=1.9 V. For S2, Vbl is set at 3.2 V, Vth=1.4 V and Vbl=3.2–1.4–0.2=1.6 V. For S3, Vbl is set at 2.8 V, Vth=1.3 V and Vbl=2.8–1.3–0.2=1.3 V. For S4, Vbl is set at 2.4 V, Vth=1.2 V and Vbl=2.4–1.2–0.2=1.0 V. For S5, Vbl is set at 2.0 V, Vth=1.1 V and Vbl=2.0–1.1–0.2=0.7 V. For S6, Vbl is set at 1.6 V, Vth=1.0 V and Vbl=1.6–1.0–0.2=0.4 V. For S7, Vbl is set at 1.2 V, Vth=0.9 V and Vbl=1.2–0.9–0.2=0.1 V.

In some cases, the overhead voltage can be smaller when Vblg is smaller. The overhead voltage provides a margin which ensures that the desired bit line and/or source line voltage is provided. In some cases, Vblg and/or the overhead voltage can be adjusted based on temperature. For example, as temperature decreases, the Vth increases.

Figure 12C:
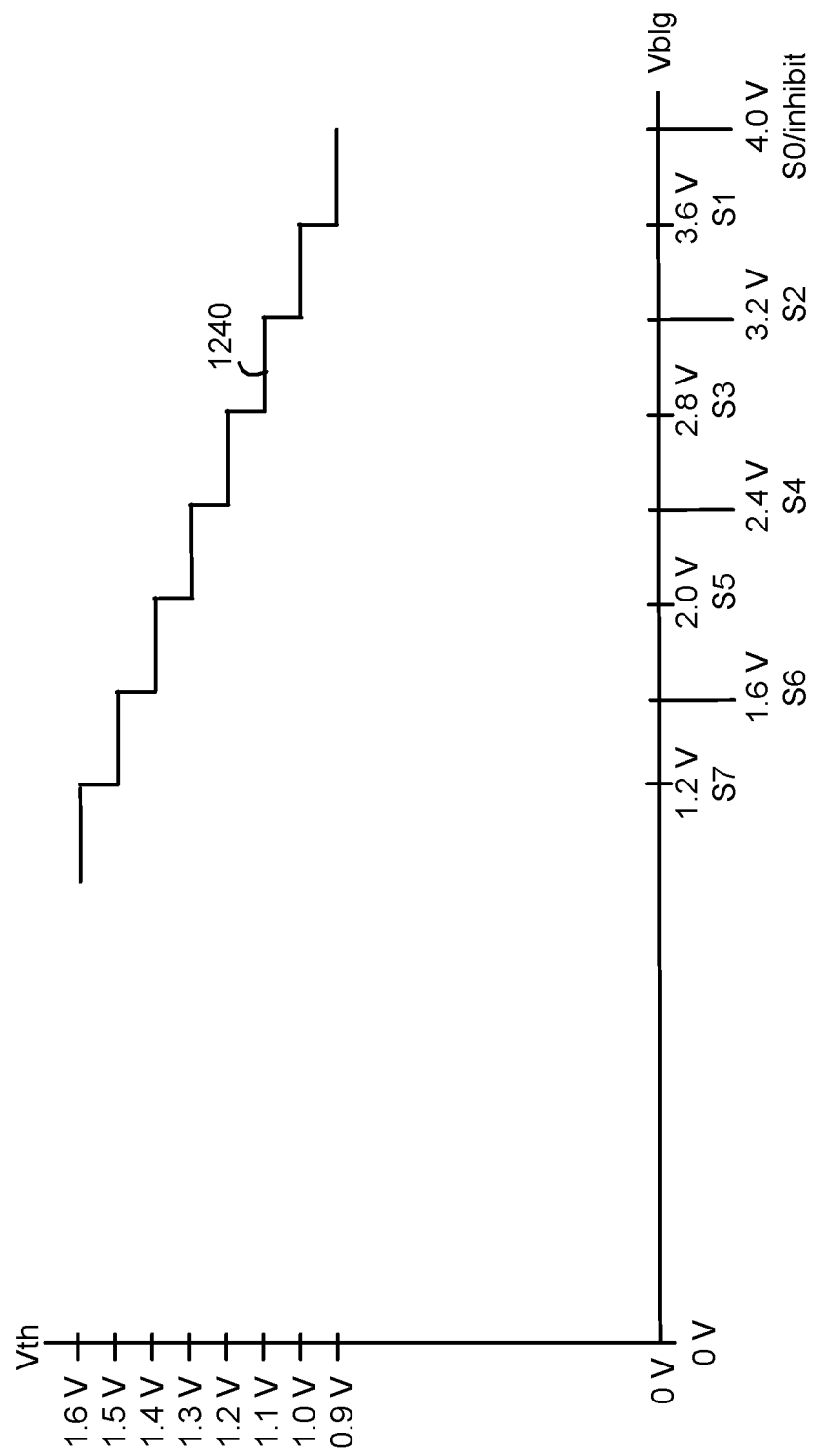
FIG. 12C depicts a plot of threshold voltage (Vth) of the transistor 1010 in FIG. 10 versus Vblg and data state.

FIG. 12C depicts a plot 1240 of threshold voltage (Vth) of the transistor 1010 in FIG. 10 versus Vblg and data state. The Vth is lower for lower data states. The Vth varies in a range of 0.9 to 1.6 V for states S0-S7, respectively, in this example, consistent with FIGS. 12A and 12B.

FIG. 13 depicts an example control signal for the isolation transistor 1015 of FIG. 10, consistent with FIGS. 12A and 12B. When the signal goes high, it provides the corresponding isolation transistor in a conductive state to pass the current step of the step-wise decreasing voltage (Vblg_d) to the control gate of the voltage-setting transistor. Plots 1300-1307 provide the high signal at t0-t1, t1-t2, t2-t3, t3-t4, t4-t5, t5-t6, t6-t7 and t7-t8 and are used for cells in the S0-S7 states, respectively.

The arrows show the time period in which the voltage Vblg on the path 1012 is FIG. 10 is floating, e.g., disconnected from a voltage source and not driven. A relatively longer time period for floating is used for the lower states. This allows a larger amount of coupling up as depicted in FIGS. 12A and 12B. That is, the voltage of the control gate of the voltage-setting transistor is floated during a number of the steps of the increasing Vbody which is relatively high when the assigned data state is relatively low.

Figure 14A:
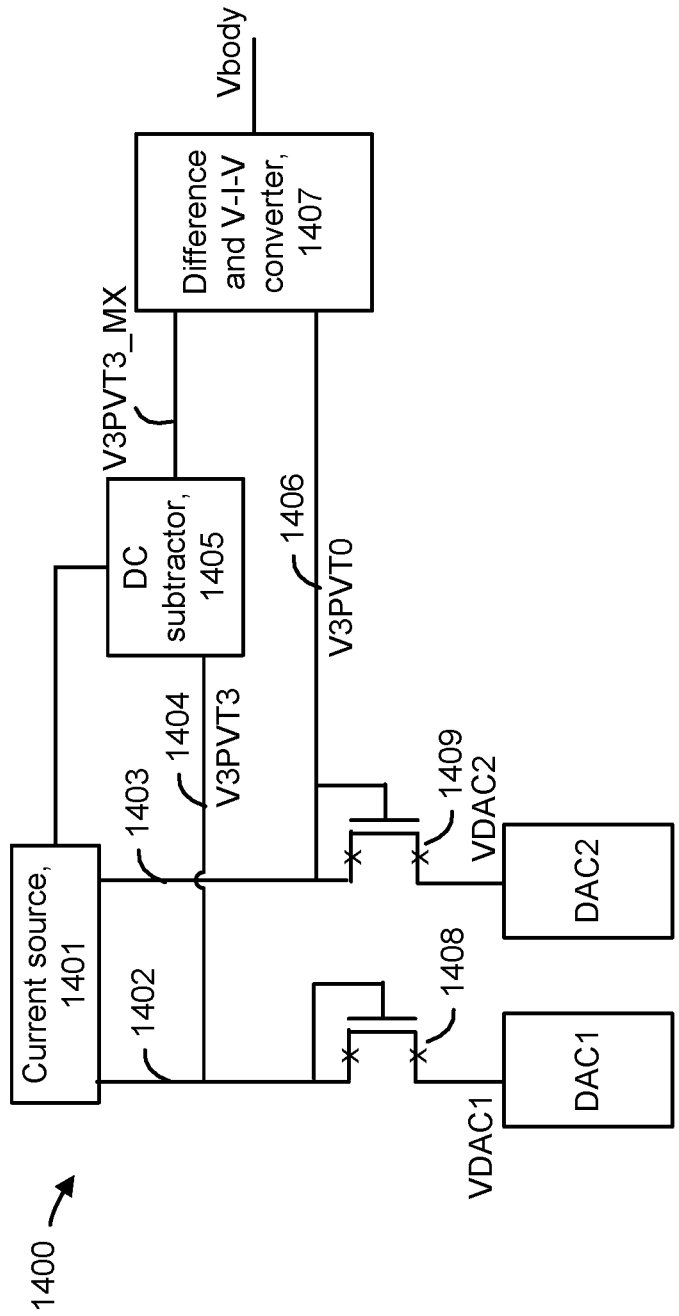
FIG. 14A depicts an example circuit for providing Vbody in FIG. 10.

FIG. 14A depicts an example circuit 1400 for providing Vbody in FIG. 10. The circuit includes a first digital-to-analog converter (DAC) DAC1 which provides a variable voltage output on a path 1402 and a DAC (DAC2) which provides a fixed voltage output on paths 1403 and 1406. The DACs are connected via transistors 1408 and 1409 to a current source 1401. The current source provides a fixed reference current to a direct current (DC) subtractor 1405. The current source may use a band gap circuit to provide a reference current which is independent of temperature variations. The subtractor subtracts the voltage from the current source from the voltage output from DAC1 (V3PVT3 on a path 1404) and provides the result (V3PVT3_MX) to a difference and voltage-current-voltage (V-I-V) converter 1407. The converter converts the voltage from the subtractor V3PVT3_MX and the voltage from the DAC2 (V3PVT0 on a path 1406) to the current domain, performs a subtraction, and converts the result back to the voltage domain as Vbody.

A simplified mathematical model is as follows: (1) V3PVT3=VT(VDAC1)+VDAC1, (2) V3PVT0=VT(VDAC2)+VDAC2, (3) V3PVT3_MX=VT(VDAC1)+VDAC1–(VDAC1–VDAC2), (4) Vbody=(V3PVT3_MX–V3PVT0)=[VT(VDAC1)+VDAC1–(VDAC1–VDAC2)–VT(VDAC2)–VDAC2]=VT(VDAC1)–VT(VDAC2).

VT(VDAC1) denotes a threshold voltage of the transistor 1408. VT(VDAC2) denotes a threshold voltage of the transistor 1409. The circuit thus provides Vbody based on a difference between a fixed DAC output and a variable output DAC, corrected for temperature variations. Further example details are provided in connection with FIG. 14B.

Figure 14B:
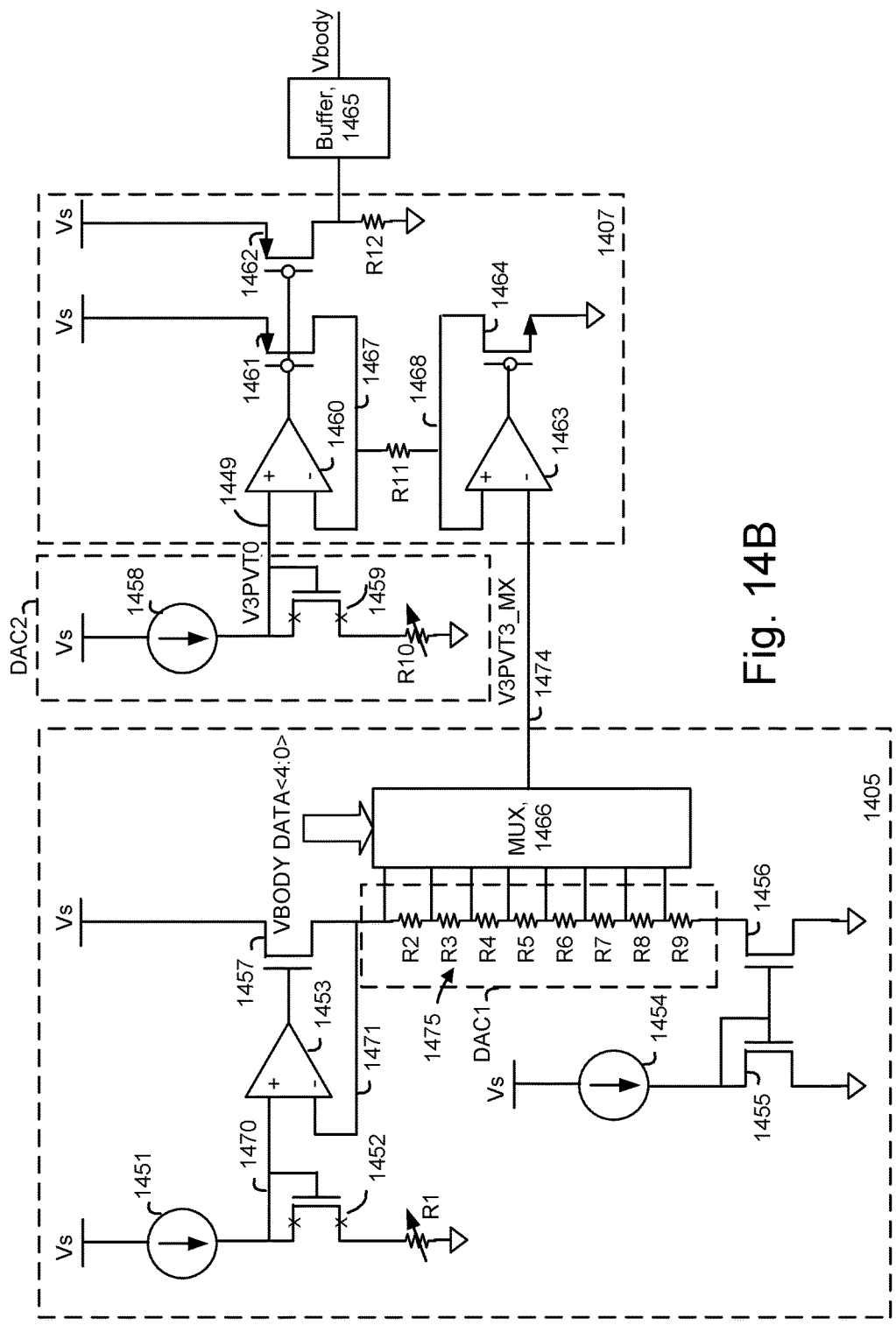
FIG. 14B depicts example details of the circuit of FIG. 14A for providing Vbody in FIG. 10.

FIG. 14B depicts example details of the circuit of FIG. 14A for providing Vbody in FIG. 10. The subtractor 1405, DAC1, DAC2 and V-I-V converter 1407 are depicted. Vs denotes a voltage source such as a power supply voltage. In the subtractor, using a current supply 1451, a variable resistor R1 and a transistor 1452, a voltage is provided on a path 1470 which is equal to a reference voltage plus the Vth of the voltage-setting transistor at the highest control gate voltage. This voltage is provided to a comparator 1453 along with a feedback voltage on a path 1471. An output of the comparator is provided to the control gate of a transistor 1457 which in turn has a source connected to a string of resistors 1475 (comprising resistor R1-R9) connected in series in the DAC1. A tap is provided after each resistor as an input to an analog multiplexer (MUX) 1466. The multiplexor outputs the voltages of each tap in turn based on a control signal VBODY DATA<4:0>, which is a four bit signal in this example. A current supply 1454 connected to transistors 1455 and 1456 in a mirror configuration pulls down current from the string of resistors. The multiplexor outputs V3PVT3_MX (see FIG. 14A) on a path 1474 to a comparator 1463 in the V-I-V converter 1407.

In the DAC2, using a current supply 1458, a variable resistor R10 and a transistor 1459, the voltage V3PVT0 is provided on a path 1449. This voltage is provided to a comparator 1460 along with a feedback voltage on a path 1467. An output of the comparator is connected to the control gates of pMOSFET transistors 1461 and 1462. A source of the transistor 1461 is connected to Vs and a drain is connected to the path 1467. A source of the transistor 1462 is connected to Vs and a drain is connected to a buffer 1465 and a resistor R12. The buffer outputs a current value of Vbody.

A comparator 1463 receives V3PVT3 and an input on the path 1468. An output of the comparator provides a control gate voltage of a transistor 1464.

The circuit generates a Vth difference based on the body effect of the voltage-setting transistor. Two DACs are used to generate the source voltage of a transistor. One DAC is fixed to a desired value and the other DAC varies in steps. The DACs can be resistor DACs and can be implemented using any technique, e.g., thermo-dac, binary-DAC or analog DAC. A DC subtractor is designed to subtract an undesired DC component which is added due to the resistor DAC. The difference circuit is designed to take the difference of the two voltages produced by the transistors at different source voltages. However, this difference is not ground referred. The V-I-V converter converts this difference to a ground referred signal.

Figure 15:
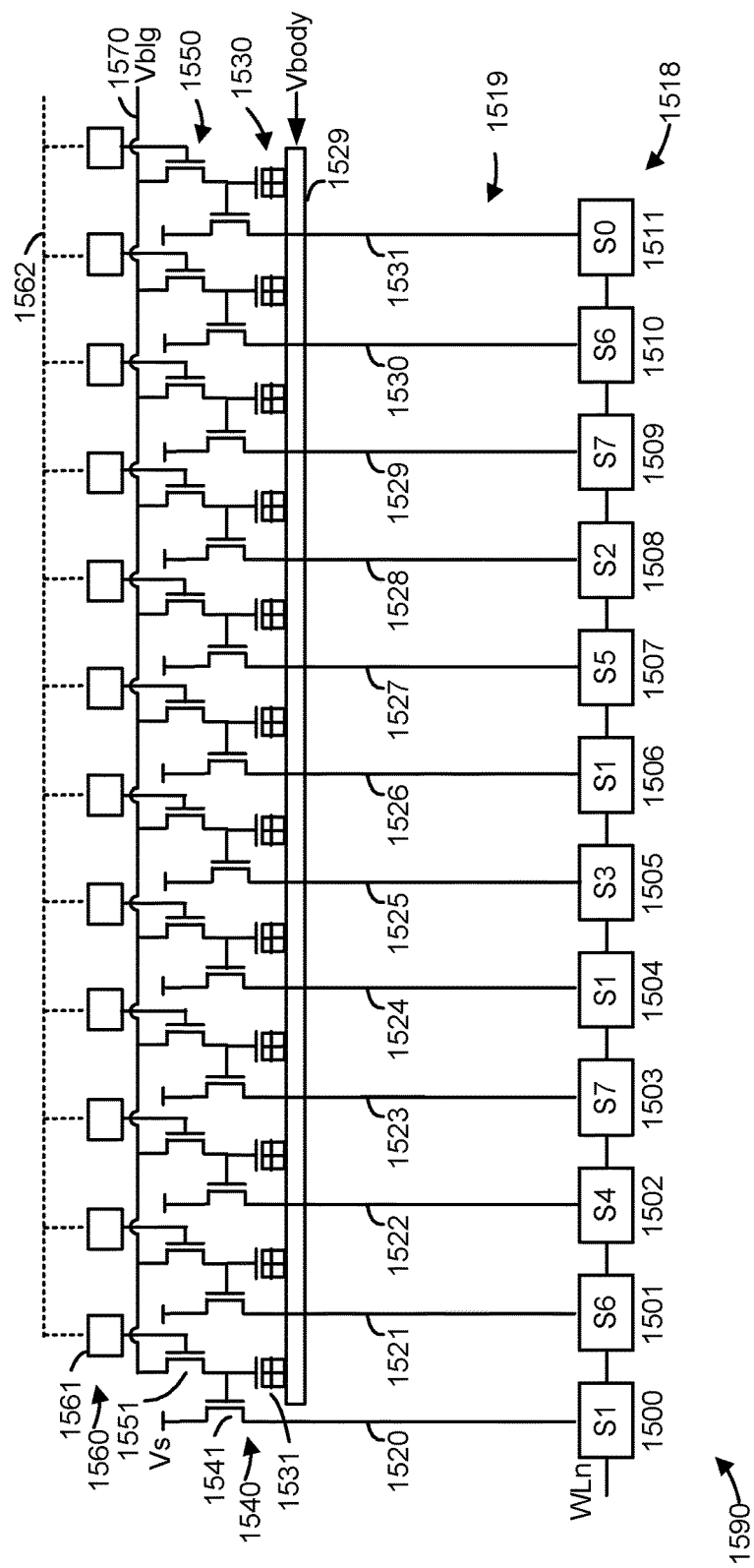
FIG. 15 depicts an example circuit comprising a set of memory cells connected to respective bit lines, a set of voltage-setting transistors connected to the set of bit lines, and a set of capacitors connected to the set of voltage-setting transistors.

FIG. 15 depicts an example circuit 1590 comprising a set of memory cells connected to respective bit lines, a set of voltage-setting transistors connected to the set of bit lines, and a set of capacitors connected to the set of voltage-setting transistors. The circuit is based on the circuit of FIG. 10 and is simplified for clarity. The example set of memory cells 1518 include cells 1500-1511 which have assigned data states of S1, S6, S4, S7, S1, S3, S1, S5, S2, S7, S6 and S0, respectively. The cells 1500-1511 are connected to a set of bit lines 1519 which includes bit lines 1520-1531, respectively. A set of capacitors 1530 including an example capacitor 1531 are connected at one side to a common body 1529 such as a substrate. Each capacitor is connected at the other side to a control gate of a respective voltage-setting transistor. A set of voltage-setting transistors 1540 includes an example voltage-setting transistor 1541. The drain of each voltage-setting transistor is connected to a supply voltage Vs and the source of each voltage-setting transistor is connected to a respective bit line.

The control gate of each voltage-setting transistor is connected to a source of a respective isolation transistor. A set of isolation transistors 1550 includes an example isolation transistor 1551. The drain of each isolation transistor is connected to a respective decoder and the source of each isolation transistor is connected to the control gate of the respective voltage-setting transistor. A set of decoders 1560 includes an example decoder 1561. The decoders are connected to a common decoder control line 1562 which provides the signals of FIG. 13 for setting an initial control gate voltage of the voltage-setting transistor. In one approach, each decoder is configured with the assigned data state of the respective memory cell and passes the voltage of the decoder control line at an appropriate time which is based on the assigned data state. The decoder in turn provides the control gate of the isolation transistor in a conductive state so the current value of Vblg_d is passed to the control gate of the voltage-setting transistor via a line 1570. After passing Vblg_d, the decoder provides the isolation transistor in a non-conductive state so that the control gate voltage of the voltage-setting transistor is floated. The grounding transistor is also made non-conductive to allow the floating. At the same time, the increasing Vbody is applied to the body 1529 to couple up the voltages of the control gates of the voltage-setting transistors when the voltages of these control gates are floated.

Figure 16:
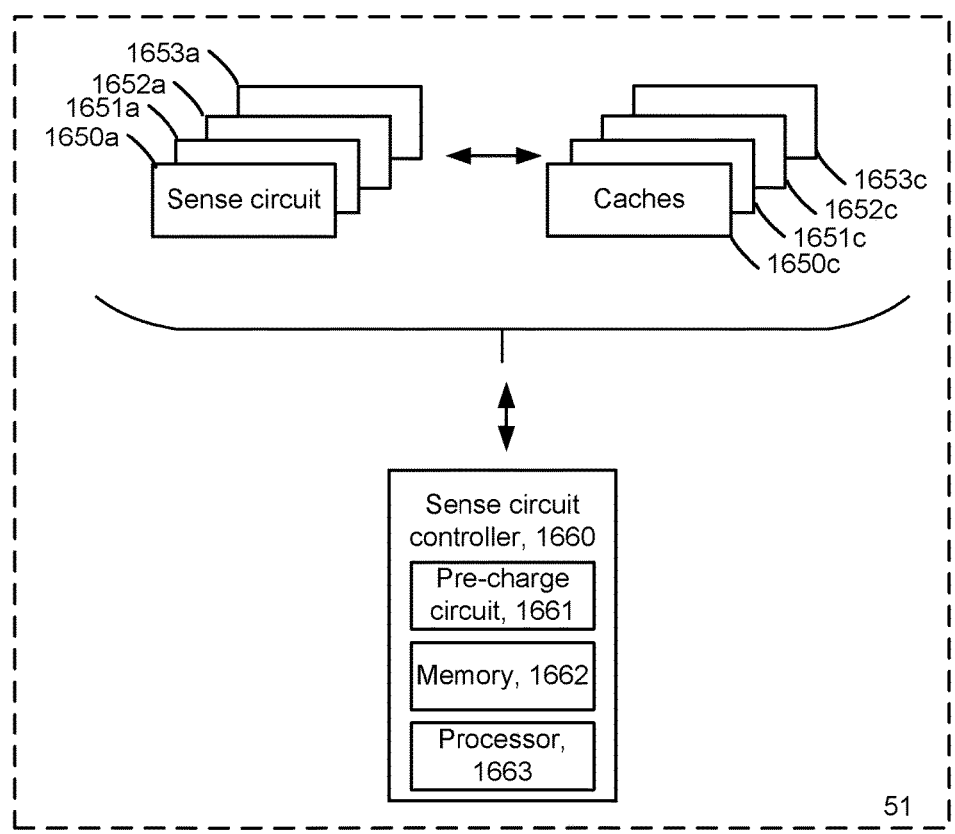
FIG. 16 depicts an example block diagram of a sense block 51 in the column control circuitry of FIG. 1.

FIG. 16 depicts an example block diagram of a sense block S1 in the column control circuitry of FIG. 1. The column control circuitry can include multiple sense blocks, where each sense block performs sensing, e.g., read, program verify or erase verify operations for multiple memory cells via respective bit lines. The sense block can also charge up the control gate voltage of the voltage-setting transistor as described herein.

In one approach, a sense block comprises multiple sense circuits, also referred to as sense amplifiers. Each sense circuit is associated with data latches and caches. For example, the example sense circuits 1650a, 1651a, 1652a and 1653a are associated with caches 1650c, 1651c, 1652c and 1653c, respectively.

In one approach, different subsets of bit lines can be sensed using different respective sense blocks. This allows the processing load which is associated with the sense circuits to be divided up and handled by a respective processor in each sense block. For example, a sense circuit controller 1660 can communicate with the set, e.g., sixteen, of sense circuits and latches. The sense circuit controller may include a pre-charge circuit 1661 which provides a voltage to each sense circuit for setting a pre-charge voltage. The sense circuit controller may also include a memory 1662 and a processor 1663.

Figure 17:
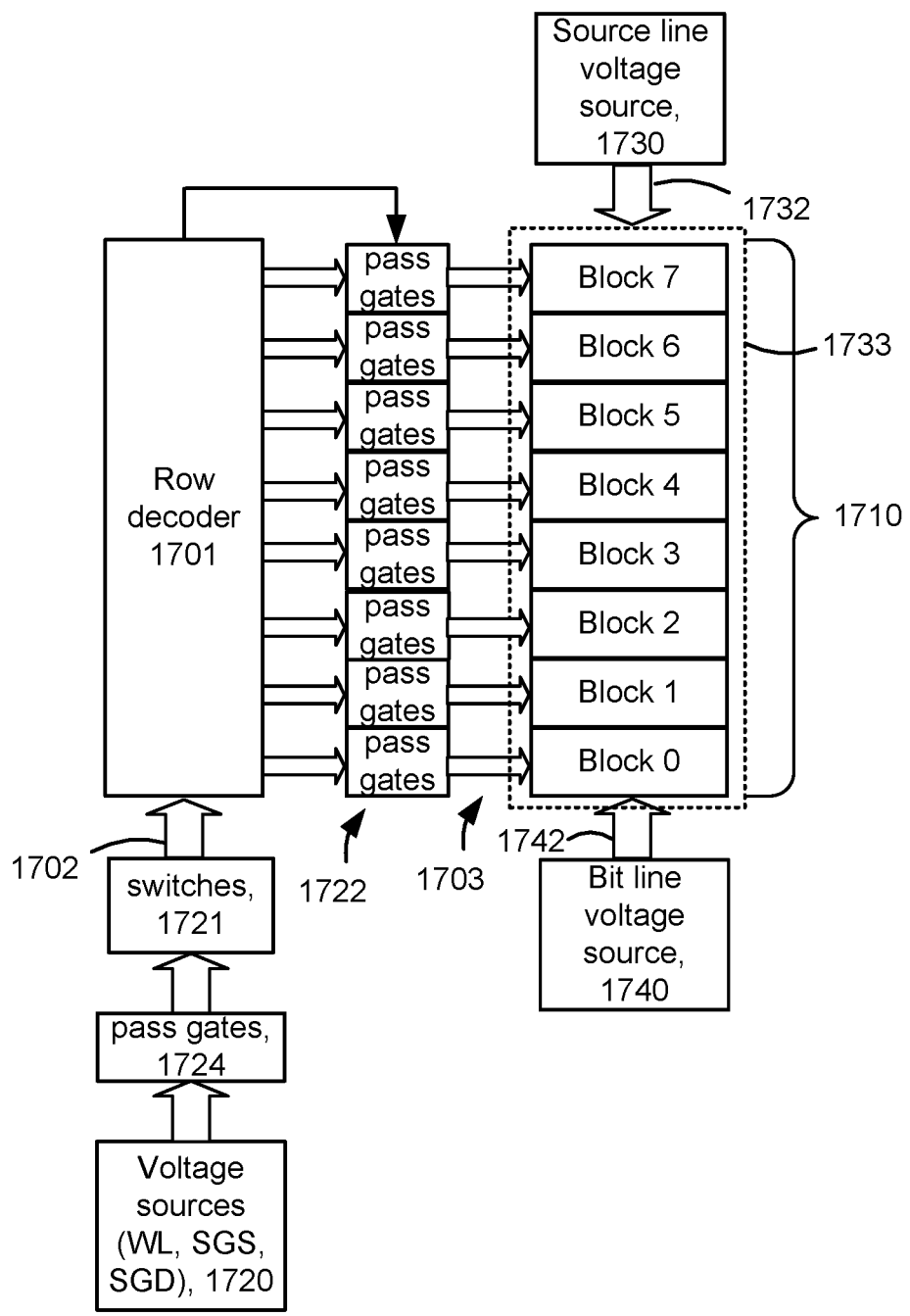
FIG. 17 depicts an example circuit for providing voltages to blocks of memory cells.

FIG. 17 depicts an example circuit for providing voltages to blocks of memory cells. In this example, a row decoder 1701 provides voltages to word lines and select gates of each block in set of blocks 1710. The set could be in a plane and includes blocks 0-7. The row decoder provides a control signal to pass gates 1722 which connect the blocks to the row decoder. Typically, operations, e.g., program, read or erase, are performed on one selected block at a time. The row decoder can connect global control lines 1702 to local control lines 1703. The control lines represent conductive paths. Voltages are provided on the global control lines from voltage sources 1720. The voltage sources may provide voltages to switches 1721 which connect to the global control lines. Pass gates 1724, also referred to as pass transistors or transfer transistors, are controlled to pass voltages from the voltage sources 1720 to the switches 1721.

The voltage sources 1720 can provided voltages on word lines (WL), SGS control gates and SGD control gates, for example.

The various components, including the row decoder, may receive commands from a controller such as the state machine 112 or the controller 122 to perform the functions described herein.

A source line voltage source 1730 provides a voltage to the source lines/diffusion region in the substrate via control lines 1732. In one approach, the source diffusion region 1733 is common to the blocks. A set of bit lines 1742 is also shared by the blocks. A bit line voltage source 1740 provides voltages to the bit lines. In one possible implementation, the voltage sources 1720 are near the bit line voltage source.

In one embodiment, an apparatus comprises: a voltage-setting transistor configured to provide a voltage on a control line, the voltage-setting transistor comprising a drain connected to a voltage source, a source connected to the control line, and a control gate connected to one terminal of a capacitor; an initial voltage-setting circuit configured to provide the voltage on the control line at an initial level based on a data state assigned to a memory cell connected to the control line; a disconnect circuit configured to float the voltage of the control gate; and a capacitor control circuit configured to increase the voltage of the control gate to an elevated level above the initial level by increasing a voltage of another terminal of the capacitor.

In another embodiment, an apparatus comprises: means for setting a voltage of each control line of a set of control lines to an initial level based on a data state assigned to a respective memory cell connected to the control line, wherein different initial levels are provided for different data states; means for increasing the voltages of the control lines to elevated levels by capacitive coupling, where an amount of the capacitive coupling is different for the different assigned data states; and means for applying a program voltage to control gates of the memory cells while the voltages of the control lines are at the elevated levels.

In various embodiments, the means for setting the voltage can include the initial voltage-setting circuit 117 and the power control/program voltage circuit 116 of FIG. 1, the sense circuits 1650*a*-1553*a* of FIG. 16 and the source line voltage source 1730 and the bit line voltage source 1740 of FIG. 17, or other logic hardware, and/or other executable code stored on a computer readable storage medium. Other embodiments may include similar or equivalent means for transmitting data.

In various embodiments, the means for increasing the voltages can include the disconnect circuit 119, the capacitor control circuit 121, and the power control/program voltage circuit 116 of FIG. 1, or other logic hardware, and/or other executable code stored on a computer readable storage medium. Other embodiments may include similar or equivalent means for transmitting data.

In various embodiments, the means for applying the program voltage can include the power control/program voltage circuit 116 of FIG. 1, the voltage sources 1720 and row decoder 1701 of FIG. 17, or other logic hardware, and/or other executable code stored on a computer readable storage medium. Other embodiments may include similar or equivalent means for transmitting data.

In another embodiment, an apparatus comprises: a set of transistors, each transistor comprising a source and a control gate, each source is connected to a respective non-volatile memory cell; a voltage source connected to the control gates and configured to drive voltages of the control gates at different drive levels; a set of capacitors comprising a capacitor connector to the control gate of each transistor; a capacitor control circuit configured to apply different voltages to a common body of the capacitors to elevate the voltages of the control gates above the different drive levels by different amounts; and a program voltage circuit configured to provide a program voltage to the respective non-volatile memory cells while the voltages of the control gates are elevated by the different amounts.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a transistor comprising a drain connected to a voltage source, a source connected to a memory cell via a control line, and a control gate connected to one terminal of a capacitor;
an initial voltage-setting circuit, to provide a voltage on the control line at an initial level based on a data state assigned to the memory cell, configured to set a voltage of the control gate to an initial voltage;
a disconnect circuit configured to float the voltage of the control gate; and
a capacitor control circuit configured to increase the voltage of the control gate from the initial voltage to an elevated level by increasing a voltage of another terminal of the capacitor when the voltage of the control gate floats.

2. The apparatus of claim 1, wherein:
the transistor is configured as a source-follower; and
the initial voltage-setting circuit is configured to control the voltage of the control gate to provide the voltage on the control line at the initial level.

3. The apparatus of claim 1, wherein:
the increase of the voltage of the control gate to the elevated level compensates for a variation in a threshold voltage of the transistor caused by a variation in a source-to-body voltage of the transistor.

4. The apparatus of claim 1, further comprising:
an isolation transistor connected to the control gate and to another voltage source, wherein the initial voltage-setting circuit, to provide the voltage on the control line at the initial level is configured to provide the isolation transistor in a conductive state, and the disconnect circuit, to float the voltage of the control gate, is configured to provide the isolation transistor in a non-conductive state.

5. The apparatus of claim 1, further comprising:
an isolation transistor connected to the control gate and to another voltage source, wherein the initial voltage-setting circuit is configured to provide a step-wise decreasing voltage to the isolation transistor and to provide the isolation transistor in a conductive state during a step of the step-wise decreasing voltage which corresponds to the data state assigned to the memory cell;
wherein the capacitor control circuit, to increase the voltage of the control gate to the elevated level, is configured to provide a step-wise increasing voltage of the another terminal of the capacitor, and to float the voltage of the control gate during one or more of the steps of the step-wise increasing voltage after the step of the step-wise decreasing voltage which corresponds to the data state assigned to the memory cell.

6. The apparatus of claim 5, wherein:
the capacitor control circuit, to float the voltage of the control gate, is configured to provide the isolation transistor in a non-conductive state during remaining steps of the step-wise decreasing voltage which do not correspond to the data state assigned to the memory cell.

7. The apparatus of claim 1, wherein:
the capacitor control circuit, to increase the voltage of the control gate to the elevated level, is configured to increase a voltage of the another terminal of the capacitor in steps, and to float the voltage of the control gate during one or more of the steps based on the data state assigned to the memory cell.

8. The apparatus of claim 7, wherein:
the voltage of the control gate is floated during a number of the steps which is relatively high when the data state is relatively low.

9. The apparatus of claim 1, wherein the control line is connected to a drain or source of the memory cell, the apparatus further comprising:
a program voltage circuit configured to apply a program voltage to a control gate of the memory cell while the voltage of the control line is at the elevated level, wherein a programming speed of the memory cell is a function of the elevated level.

10. The apparatus of claim 1, wherein the control line is connected to a drain or source of the memory cell, the apparatus further comprising:
a sense circuit configured to apply a sense voltage to a control gate of the memory cell and to sense whether the memory cell is in a conductive state while the voltage of the control gate is at the elevated level.

11. An apparatus, comprising:
means for setting a voltage of each control line of a set of control lines to an initial level based on a data state assigned to a respective memory cell connected to the control line, wherein different initial levels are provided for different assigned data states;
means for increasing the voltages of the control lines to elevated levels by capacitive coupling, where an amount of the capacitive coupling is different for the different assigned data states; and
means for applying a voltage to control gates of the memory cells while the voltages of the control lines are at the elevated levels.

12. The apparatus of claim 11, wherein:
the means for setting the voltage of each control line to the initial level comprises means for biasing a respective source-follower transistor with a control gate voltage which is based on the data state assigned to the respective memory cell.

13. The apparatus of claim 12, wherein:
the means for biasing the respective source-follower transistor comprising means for passing a selected voltage from a step-wise decreasing voltage waveform to the control gate of the respective source-follower transistor and blocking remaining voltages from the step-wise decreasing voltage waveform from the control gate of the respective source-follower transistor.

14. The apparatus of claim 12, wherein:
the means for increasing the voltages of the control lines to the elevated levels by capacitive coupling comprises means for increasing a voltage of respective capacitors connected to control gates of the respective source-follower transistors while floating voltages of the control gates of the respective source-follower transistors.

15. The apparatus of claim 1, wherein the means for increasing increases the voltages of the respective capacitors in steps, the apparatus further comprising:
means for floating the voltages of the control gates of the respective source-follower transistors during a number of the steps which is based on the data state assigned to the respective memory cell.

16. An apparatus, comprising:
a set of transistors, each transistor comprising a source and a control gate, each source is connected to a respective non-volatile memory cell;
a voltage source connected to the control gates of the transistors and configured to drive voltages of the control gates of the transistors at different drive levels;
a set of capacitors comprising a capacitor connector to the control gate of each transistor;
a capacitor control circuit configured to apply different voltages to a common body of the capacitors to elevate the voltages of the control gates of the transistors above the different drive levels by different amounts; and
a voltage circuit configured to provide a control gate voltage to the respective non-volatile memory cells while the voltages of the control gates of the transistors are elevated by the different amounts.

17. The apparatus of claim 16, wherein:
the voltages of the control gates of the transistors control programming speeds of the non-volatile memory cells in a multi-state programming operation in which the non-volatile memory cells are programmed to a plurality of data states.

18. The apparatus of claim 16, wherein:
the elevation of the voltages of the control gates of the transistors by the different amounts compensates for differences in threshold voltages of the transistors.

19. The apparatus of claim 16, wherein:
the capacitor control circuit comprise a first digital-to-analog converter configured to provide a fixed voltage, a second digital-to-analog converter configured to provide a plurality of voltages, a multiplexer configured to select each voltage of the plurality of voltages in turn, and a subtractor configured to subtract the fixed voltage from each of the plurality of voltages, wherein the subtractor is connected to the common body.

20. The apparatus of claim 19, wherein:
the subtractor comprises a voltage-current-voltage converter.

* * * * *